United States Patent
Zhang et al.

(10) Patent No.: US 9,640,432 B2
(45) Date of Patent: May 2, 2017

(54) MEMORY DEVICE STRUCTURE AND FABRICATING METHOD THEREOF

(71) Applicant: Semiconductor Manufacturing International (Shanghai) Corporation, Shanghai (CN)

(72) Inventors: Jinshuang Zhang, Shanghai (CN); Shaobin Li, Shanghai (CN); Sheng-Fen Chiu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/180,508

(22) Filed: Jun. 13, 2016

(65) Prior Publication Data

US 2016/0365313 A1    Dec. 15, 2016

(30) Foreign Application Priority Data

Jun. 12, 2015 (CN) .......................... 2015 1 0325294

(51) Int. Cl.
*H01L 29/788* (2006.01)
*H01L 21/768* (2006.01)
*H01L 27/11521* (2017.01)
*H01L 27/11526* (2017.01)

(52) U.S. Cl.
CPC .. *H01L 21/76877* (2013.01); *H01L 21/76816* (2013.01); *H01L 21/76843* (2013.01); *H01L 27/11521* (2013.01); *H01L 27/11526* (2013.01)

(58) Field of Classification Search
CPC ............. H01L 27/11517; H01L 29/788; H01L 29/42324; H01L 29/66825; H01L 29/792; H01L 2924/13081; H01L 2924/13085; H01L 27/11558; H01L 29/42328; H01L 27/108; H01L 27/11585; H01L 2924/1436; H01L 28/40; H01L 27/10; H01L 29/42336; H01L 27/112; H01L 27/11253; H01L 29/6659
USPC ........... 257/314, 315, 316, 318, 319, 68, 71, 257/E21.681, E21.685; 438/257, 259, 438/262, 290
See application file for complete search history.

(56) References Cited

U.S. PATENT DOCUMENTS

2004/0166631 A1* 8/2004 Hurley .............. H01L 27/11521 438/257

* cited by examiner

*Primary Examiner* — Sonya D McCall Shepard
(74) *Attorney, Agent, or Firm* — Anova Law Group, PLLC

(57) ABSTRACT

The disclosed subject matter provides a memory device structure and a fabricating method thereof. The memory device structure includes a substrate including a device region and a peripheral region; multiple gate structures; a first dielectric layer, a second barrier layer, multiple source interconnecting lines, and multiple drain region plugs; a second dielectric layer in the device region include multiple source line plugs, and multiple second drain region plugs, and multiple controlling gate plugs; a third dielectric layer including multiple first conductive layers; a fourth dielectric layer including multiple interconnecting structures; a fifth dielectric layer including multiple second conductive layers; and a sixth dielectric layer including multiple third conductive layers.

20 Claims, 16 Drawing Sheets

MEMORY DEVICE STRUCTURE AND FABRICATING METHOD THEREOF

CROSS-REFERENCES TO RELATED APPLICATIONS

This application claims the priority of Chinese patent application No. 201510325294.X, filed on Jun. 12, 2015, the entire content of which is incorporated herein by reference.

TECHNICAL FIELD

The present disclosure generally relates to the field of semiconductor technologies and, more particularly, relates to a memory device structure and a fabricating method thereof.

BACKGROUND

In current semiconductor industries, the products of the integrated circuit (IC) devices can be roughly divided into three types, including analog circuits, digital circuits, and mixed signal circuits. Memory devices belong to one important type of the digital circuits. In recent years, the development of flash memories is particularly rapid comparing to other types of memory devices. One advantage of the flash memory devices is the ability of storing data without applying external electrical power. Therefore, a flash memory device can be used as a nonvolatile rewritable data storage for storing data that can be maintained when the external electrical power is disconnected. In addition, the flash memory devices have many other advantages, such as high integration level, fast data-storing speed, good erasability and rewritability, etc. Therefore, the flash memory devices are widely used in many fields including the micro-electro-mechanical systems (MEMS), the automation controlling systems, etc. Thus, how to improve the performance of the flash memory devices and how to reduce the product costs of the flash memory devices become very important for research.

NOR gate erase through oxide (ETOX) flash memory device is one type of flash memory device that has excellent features. The structure of an NOR gate ETOX flash memory device can include a gate structure on the surface of a substrate, and a source region and a drain region located on both sides of the gate structure respectively. The gate structure may include a tunneling oxide layer on the surface of the substrate, a floating gate layer on the surface of the tunneling oxide layer, an insulating layer on the surface of the floating gate layer, and a controlling gate layer on the surface of the insulating layer.

Performances of various kinds of electronic devices are improving as the development of the high density flash memory technology. For example, the flash memory devices are used as data-storage devices in digital cameras, laptops, tablets, and other electrical equipment. Thus, reducing the size of the flash memory cells and reducing the costs of manufacturing flash memory devices may be challenges for current technology development. As for the NOR ETOX flash memory devices, a self-align contact fabrication technique can be used to form the conductive structures on the surfaces of the source region and the drain region to satisfy the requirements for forming smaller-sized flash memory devices.

However, the existing fabrication process for forming a flash memory device is complicated and the performance of the flash memory devices may still have defects.

BRIEF SUMMARY

The disclosed subject matter provides a memory device structure and a related fabricating method. The memory device structure has a good stability and a good reliability.

An aspect of the disclosed subject matter provides a method for forming a memory device structure, comprising: providing a substrate including a device region and a peripheral region, wherein the device region of the substrate includes a plurality of isolation structures, the substrate between adjacent isolation structures includes active regions; forming a plurality of gate structures on the surface of the substrate, wherein a plurality of source region trenches and a plurality of drain region trenches are located on two sides of the gate structures respectively, a plurality of source regions are located in the active regions at the bottom of the source region trenches, a plurality of drain regions are located in the active regions at the bottom of the drain region trenches, and the gate structures include a plurality of controlling gate layers, and a first barrier layer on the surfaces of the controlling gate layers; forming a first dielectric layer, a second barrier layer, a plurality of source interconnecting lines, and a plurality of drain region plugs, wherein the source interconnecting line are located in the source region trenches in the device region, and the first drain region plugs are located on the surfaces of the drain regions in the device region; forming a second dielectric layer on the surfaces of the first dielectric layer, the second barrier layer, the first drain region plugs, and the source interconnecting lines, wherein the second dielectric layer in the device region include a plurality of source line plugs on the surfaces of the source interconnecting lines, and a plurality of second drain region plugs on the first drain region plugs, and the second dielectric layer and the first barrier layer in the peripheral region include a plurality of controlling gate plugs on the surfaces of the controlling gate layers; forming a third dielectric layer on the surface of the second dielectric layer, wherein the third dielectric layer includes a plurality of first conductive layers on the source line plugs, the second drain region plugs, and the controlling gate plugs; forming a fourth dielectric layer on the third dielectric layer and the first conductive layers, wherein the fourth dielectric layer includes a plurality of interconnecting structures on the surfaces of the first conductive layers; forming a fifth dielectric layer on the surfaces of the fourth dielectric layer and the interconnecting structures, wherein the fifth dielectric layer includes a plurality of second conductive layers; and forming a sixth dielectric layer on the surfaces of the fifth dielectric layer and the second conductive layers, wherein the sixth dielectric layer includes a plurality of third conductive layers.

In some embodiments, the gate structures extend from the device region to the surface of the peripheral region and extend cross the surfaces of the active regions; the bottom portions of the source region trenches and the drain region trenches expose the surfaces of the active regions and the isolation structures in the device region and the peripheral region; the first dielectric layer is located on the surfaces of the active regions and the isolation structures, the second barrier layer is located on the surfaces of the isolation structures in the device region trenches, and in the drain region trenches and the source region trenches in the peripheral region; the source line plugs on top of a same source interconnecting line are connected to a same first conductive layer; the interconnecting structures in the device region are connected to corresponding adjacent source interconnecting lines through the first conductive layers and the source line plugs; the second conductive layers in the device region are connected to the second drain region plugs that are located on top of the adjacent drain region trenches through the interconnecting structures; and the third conductive layers are connected to the controlling gate plugs in the peripheral region through the second conductive layers and the interconnecting structures.

In some embodiments, the method further comprises a method for forming the first dielectric layer, the second barrier layer, the source interconnecting lines and the first drain region plugs, including: forming the first dielectric layer on the surfaces of the source regions and the isolation structures, wherein the surface of the first dielectric layer levels with the surface of gate structures; removing the first dielectric layer on the surfaces of the drain region trenches in the device region to form a plurality of drain region via holes in the drain region trenches, and removing the first dielectric layer in the drain region trenches and the source region trenches that are in the peripheral region to expose the drain region trenches and the source region trenches that are in the peripheral region; forming a second barrier layer in the drain region via holes, and in the drain region trenches and the source region trenches that are in the peripheral region; after forming the second barrier layer, removing the first dielectric layer in the source region trenches and the drain region trenches; and after removing the first dielectric layer in the source region trenches and the drain region trenches, forming a plurality of first drain region plugs on the surfaces of the active regions in the drain region trenches in the device region, and forming a plurality of source interconnecting lines in the source region trenches in the device region.

In some embodiments, the method further comprises a method for forming the first drain region plugs and the source interconnecting lines, including: forming a conductive material film on the surfaces of the source region trenches, the drain region trenches, the first dielectric layer, the gate structures, and the second barrier later; and planarizing the conductive material film until the surfaces of the first dielectric layer, the gate structures, and the second barrier layer are exposed, to form the first drain region plugs and the source interconnecting lines.

In some embodiments, the gate structures further comprises: a first gate dielectric layer on the surfaces of the source regions of the substrate; a floating gate layer on the surface of the first gate dielectric layer; and a second gate dielectric layer on the surface of the floating gate layer and the isolation structures; wherein the controlling gate layers are located on the surface of the second gate dielectric layer.

In some embodiments, the gate structures further comprises: a plurality of sidewalls on the side surfaces of the first gate dielectric layer, the floating gate layer, the second gate dielectric layer, the controlling gate layers, and the first barrier layer.

In some embodiments, the interconnecting structures comprise: a plurality of interconnecting plugs on the surfaces of the first conductive layers; and a plurality of interconnecting layers on the surfaces of the interconnect plugs; wherein the interconnecting layers in the device region are connected to source line plugs on the surfaces of adjacent source interconnecting lines through the interconnect plugs.

In some embodiments, the method further comprises forming a plurality of second plugs in the fifth dielectric layer, wherein: the second plugs are located on the surfaces of the interconnecting structures; the second conductive layers are located on the top surface of the second plugs; and the second conductive layers in the device region are connected to the second drain region plugs that are located on top of adjacent drain region trenches through the second plugs and the interconnecting structures.

In some embodiments, the method further comprises forming a plurality of third plugs in the sixth dielectric layer, wherein: the third plugs are located on the surface of the second dielectric layer; the third conductive layers are located on the top surfaces of the third plugs; and the third conductive layers are connected to the controlling gate plugs in the peripheral region through the third plugs, the second conductive layers, and the interconnecting structures.

In some embodiments, a material of the first dielectric layer is different from a material of the second barrier layer.

In some embodiments, the locations of the source line plugs are corresponding to the locations of the isolation structures at the bottom of the source region trenches.

In some embodiments, the method further comprises a method for forming the source line plugs, the second drain region plugs, and the controlling gate plugs, including: forming a plurality of first via holes in the second dielectric layer, wherein the first via holes expose partial surfaces of the source interconnecting lines in the device region, the first drain region plugs, and the first barrier layer in the peripheral region; etching the first barrier layer on the bottom of the first via holes in the peripheral region until the surfaces of the controlling gate layers are exposed, to form the controlling gate via holes in the peripheral region; and filling a conductive material into the first via holes in the device region and the controlling gate via holes in the peripheral region, to form the source line plugs and the second drain region plugs in the device region, and to form the controlling gate plugs in the peripheral region.

Another aspect of the disclosed subject matter provides a memory device structure, comprising a substrate including a device region and a peripheral region, wherein the device region of the substrate includes a plurality of isolation structures, the substrate between adjacent isolation structures includes active regions; a plurality of gate structures on the surface of the substrate, wherein a plurality of source region trenches and a plurality of drain region trenches are located on two sides of the gate structures respectively, a plurality of source regions are located in the active regions at the bottom of the source region trenches, a plurality of drain regions are located in the active regions at the bottom of the drain region trenches, and the gate structures include a plurality of controlling gate layers, and a first barrier layer on the surfaces of the controlling gate layers; a first dielectric layer, a second barrier layer, a plurality of source interconnecting lines, and a plurality of drain region plugs, wherein the source interconnecting line are located in the source region trenches in the device region, and the first drain region plugs are located on the surfaces of the drain regions in the device region; a second dielectric layer on the surfaces of the first dielectric layer, the second barrier layer, the first drain region plugs, and the source interconnecting lines, wherein the second dielectric layer in the device region include a plurality of source line plugs on the surfaces of the source interconnecting lines, and a plurality of second drain region plugs on the first drain region plugs, and the second dielectric layer and the first barrier layer in the peripheral region include a plurality of controlling gate plugs on the surfaces of the controlling gate layers; a third dielectric layer on the surface of the second dielectric layer, wherein the third dielectric layer includes a plurality of first conductive layers on the source line plugs, the second drain region plugs, and the controlling gate plugs; a fourth dielectric layer on the third dielectric layer and the first conductive layers, wherein the fourth dielectric layer includes a plurality of interconnecting structures on the surfaces of the first conductive layers; a fifth dielectric layer on the surfaces of the fourth dielectric layer and the interconnecting structures, wherein the fifth dielectric layer includes a plurality of second conductive layers; and a sixth dielectric layer on the surfaces of the fifth dielectric layer and the second conductive layers, wherein the sixth dielectric layer includes a plurality of third conductive layers.

In some embodiments, the gate structures extend from the device region to the surface of the peripheral region and extend cross the surfaces of the active regions; the bottom portions of the source region trenches and the drain region trenches expose the surfaces of the active regions and the isolation structures in the device region and the peripheral region; the first dielectric layer is located on the surfaces of the active regions and the isolation structures, the second barrier layer is located on the surfaces of the isolation structures in the device region trenches, and in the drain region trenches and the source region trenches in the peripheral region; the source line plugs on top of a same source interconnecting line are connected to a same first conductive layer; the interconnecting structures in the device region are connected to corresponding adjacent source interconnecting lines through the first conductive layers and the source line plugs; the second conductive layers in the device region are connected to the second drain region plugs that are located on top of the adjacent drain region trenches through the interconnecting structures; and the third conductive layers are connected to the controlling gate plugs in the peripheral region through the second conductive layers and the interconnecting structures.

In some embodiments, the gate structures further comprises: a first gate dielectric layer on the surfaces of the source regions of the substrate; a floating gate layer on the surface of the first gate dielectric layer; and a second gate dielectric layer on the surface of the floating gate layer and the isolation structures; wherein the controlling gate layers are located on the surface of the second gate dielectric layer.

In some embodiments, the gate structures further comprises: a plurality of sidewalls on the side surfaces of the first gate dielectric layer, the floating gate layer, the second gate dielectric layer, the controlling gate layers, and the first barrier layer.

In some embodiments, the interconnecting structures comprise: a plurality of interconnecting plugs on the surfaces of the first conductive layers; and a plurality of interconnecting layers on the surfaces of the interconnect plugs; wherein the interconnecting layers in the device region are connected to source line plugs on the surfaces of adjacent source interconnecting lines through the interconnect plugs.

In some embodiments, the memory device structure further comprises a plurality of second plugs in the fifth dielectric layer, wherein: the second plugs are located on the surfaces of the interconnecting structures; the second conductive layers are located on the top surface of the second plugs; and the second conductive layers in the device region are connected to the second drain region plugs that are located on top of adjacent drain region trenches through the second plugs and the interconnecting structures.

In some embodiments, the memory device structure further comprises a plurality of third plugs in the sixth dielectric layer, wherein: the third plugs are located on the surface of the second dielectric layer; the third conductive layers are located on the top surfaces of the third plugs; and the third conductive layers are connected to the controlling gate plugs in the peripheral region through the third plugs, the second conductive layers, and the interconnecting structures.

In some embodiments, a material of the first dielectric layer is different from a material of the second barrier layer.

In some embodiments, the locations of the source line plugs are corresponding to the locations of the isolation structures at the bottom of the source region trenches.

Other aspects of the disclosed subject matter can be understood by those skilled in the art in light of the description, the claims, and the drawings of the disclosed subject matter.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the invention.

It has been found that as the structure sizes of the memory device get smaller, the device density of the memory device may be higher, the difficulty of the fabrication process for the memory device may be harder, and the shapes and the properties of the memory device may have a higher probability to be defective.

Figure 1:
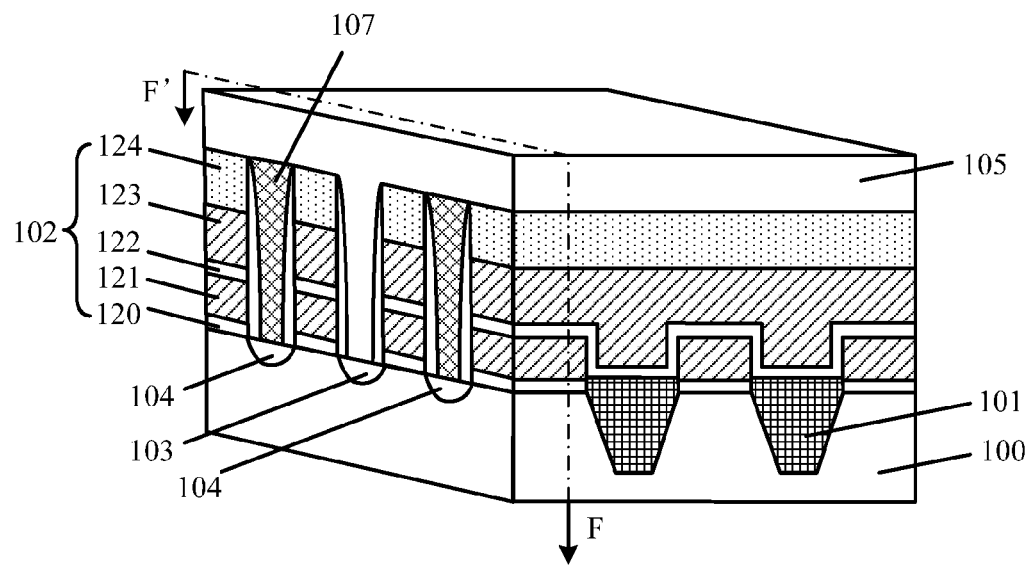
FIGS. 1-3 illustrate cross-sectional structures of an existing memory device structure corresponding to certain stages of a fabrication process.
Figure 2:
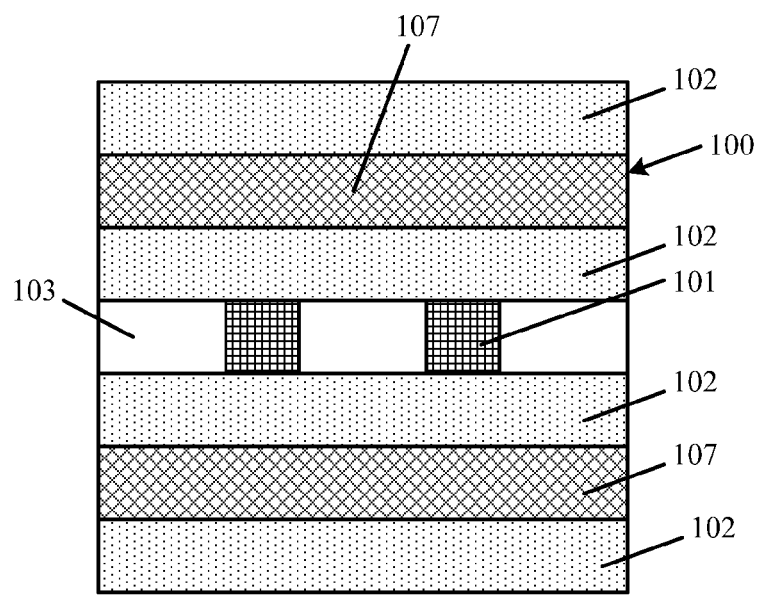
Figure 3:
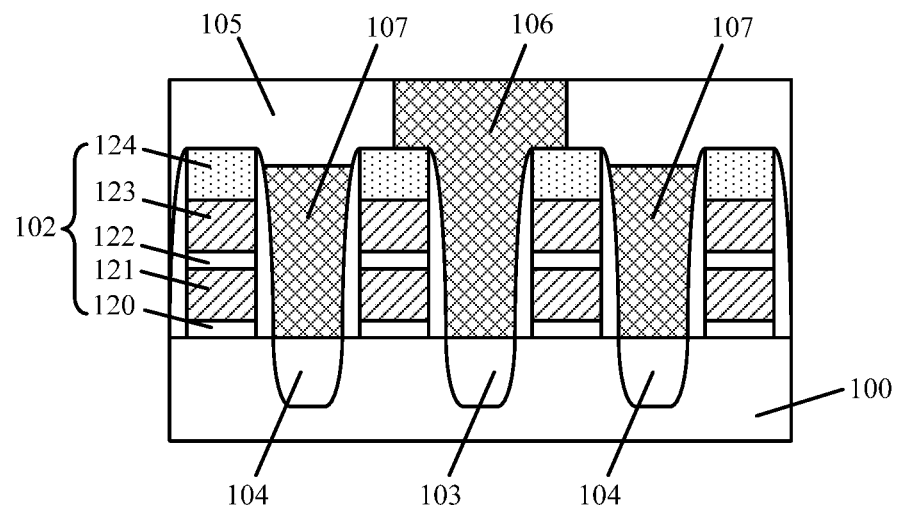

Referring to FIGS. 1-3, cross-sectional structures of an existing memory device structure corresponding to certain stages of a fabrication process is shown.

FIG. 2 is a top view of the structure of the memory device illustrated in FIG. 1. As shown in FIG. 1 and FIG. 2, the memory device includes a substrate 100. The substrate 100 may include a plurality of active regions and multiple isolation structures 101 between adjacent active regions. Multiple gate structures 102 are on the surface of the substrate 100. The gate structures 102 may extend over the surfaces of multiple active regions. The two sides of the gate structures 102 may expose the source region trenches and the drain regions of the surface of the active regions in the substrate 100 and the surface of the isolation structures 101. The substrate 100 on the bottom of the drain region trenches may include a plurality of drain regions 103. The substrate 100 on the bottom of the source region trenches may include a plurality of source regions 104. The source region trenches may include source lines 107. The surface of the source lines 107, the surface of the gate structures 102 and the drain region trenches may include first dielectric layer 105.

It should be noted that FIG. 2 shows a top surface of the device before forming the first dielectric layer 105. In other words, the first dielectric layer 105 is not shown in FIG. 2.

The gate structure 102 may include a first gate dielectric layer 120 on a partial surface of the active regions on the substrate 100. The gate structure 102 may also include a floating gate layer 121 on the surface of the first gate dielectric layer 120. The gate structure 102 may also include a second gate dielectric layer 122 on the surface of the floating gate layer 121. The gate structure 102 may also include a controlling gate layer 123 on the surface of the second gate dielectric layer 122. The gate structure 102 may also include a mask layer 124 on the surface of the controlling gate layer 123.

FIG. 3 is a cross-sectional view of the structure of the memory device shown in FIG. 1 along a direction of FF'. Multiple drain electrode plugs 106 may be formed in the dielectric layer 105. The drain electrode plugs 106 may be located on the surfaces of the multiple drain regions 103.

After forming the memory device structure as shown in FIG. 3, multiple word lines, bit lines, source lines, and source interconnecting lines are formed subsequently.

A plurality of bit lines may be located at a same layer and arranged in parallel, and each of the bit lines may be located on top of the plurality of drain electrode plugs 106 in a same active region. That is, each of the bit lines may be connected to the plurality of drain electrode plugs 106 in the same active region.

Further, a source interconnecting line may be formed in the same layer of the bit lines. The source interconnecting line is parallel to the multiple bit lines. The source interconnecting line may be connected to the plurality of source lines 107 by multiple first conductive plugs. The source interconnecting lines may be used for applying bias on the plurality of source lines 107 to drive the memory device structure.

In addition, the word lines may be located in a different layer of the bit lines. A plurality of word lines may be arranged in parallel in a same layer. Each of the word lines may be connected to controlling gate layer 123 by multiple second conductive plugs for applying bias to the controlling gate layer 123.

However, since the bit lines and the source interconnecting lines are in a same layer, an area occupied by the memory device structure may be larger which may not be beneficial to the device density and the device integration.

Furthermore, in order to reduce the area occupied by the memory device structure, the bias may be applied to the multiple source lines 107 by only one source interconnecting line. Therefore, when the voltage is transmitting from the source interconnecting line to multiple source lines 107, a voltage dropping phenomenon may obviously occur. Thus, the multiple source lines 107 may have different voltages, result in an unstable working performance of the memory device structure. Correspondingly, since the source interconnecting line is connected to the multiple source lines 107 by the first conductive plugs, and in order to reduce the area occupied by the memory device structure, the first conductive plugs may have relatively small contacting areas with the source lines 107 and the source interconnecting line. So that the resistances between the source interconnecting line, the first conductive plugs, and the source lines 107 may be relatively large, which may increase the voltage dropping between the source interconnecting line and each of the source lines 107.

In addition, because the source interconnecting line may be in a same layer of the bit lines, the source interconnecting line may have a relatively close distance with the neighboring bit lines. So that the first conductive plugs and the drain electrode plugs 106 may have relatively close distances.

Thus, a bridging effect may occur due to the short distances between the bit lines and the source interconnecting line, and/or the short distances between the first conductive plugs and the drain electrode plugs 106. Therefore, the formed memory device structure may have a poor performance and an unstable reliability.

In order to solve the problems as mentioned above, the disclosed subject matter provides a memory device structure and a method for fabricating the memory device structure. In the disclosed memory device structure, a second dielectric layer is formed on the surfaces of the first dielectric layer, the second barrier layer, the drain region plugs, and the source interconnecting lines. In the second dielectric layer, a plurality of source line plugs, a plurality of second drain region plugs, and a plurality of controlling gate plugs are formed. The third dielectric layer is located on the surface of the second dielectric layer. In the third dielectric layer, a plurality of first conductive layers is formed on the top of the source line plugs, the second drain region plugs, and the controlling gate plugs. The plurality of the source line plugs on top of the same source interconnecting line may be connected to the same first conductive layer. Because each of the first conductive layers may be used to apply bias on each of the source region plugs, when applying bias to the plurality of the source interconnecting lines, the voltage dropping problem may be reduced. Therefore, the voltage differences among the plurality of the source interconnecting lines may be eliminated.

A fourth dielectric layer can be formed on the surface of the third dielectric layer. In the fourth dielectric layer, a plurality of the interconnecting structures are formed. The interconnecting structures may be connected to the adjacent source interconnecting lines by the first conductive layers and the source line plugs. Therefore, the electrical connection between the adjacent source interconnecting lines may be built. In addition, by using the interconnecting structures connecting to the adjacent source interconnecting lines, the distances between the interconnecting structures and the first conductive layers or the second conductive layers may be increased. Therefore, the bridging effect between the interconnecting structures and the first conductive layers, or the second conductive layers may be avoided.

In the fifth dielectric layer located on the surface of the fourth dielectric layer and the interconnecting structures, a second conductive layer can be formed. The second conductive layer is in a device region, and may be connected to the second drain region plugs located on top of the trenches of adjacent drain regions by the interconnecting structures. That is, the second conductive layer may be used as bit lines of the memory device for applying bias to the plurality of drain region plugs. Because the interconnecting structures and the second conductive layer may be located at different layers, the bridging effect caused by the short distances between the interconnecting structures and the second conductive layer may be avoided.

In order to explain the motivation, the characteristics, and the benefits more clearly, detailed explanation of the disclosed subject matter is described in following in connection with more figures.

FIGS. 4-33 illustrate cross-sectional structures of an exemplary memory device structure corresponding to certain stages of a fabrication process in accordance with various embodiments of the disclosed subject matter.

Figure 4:
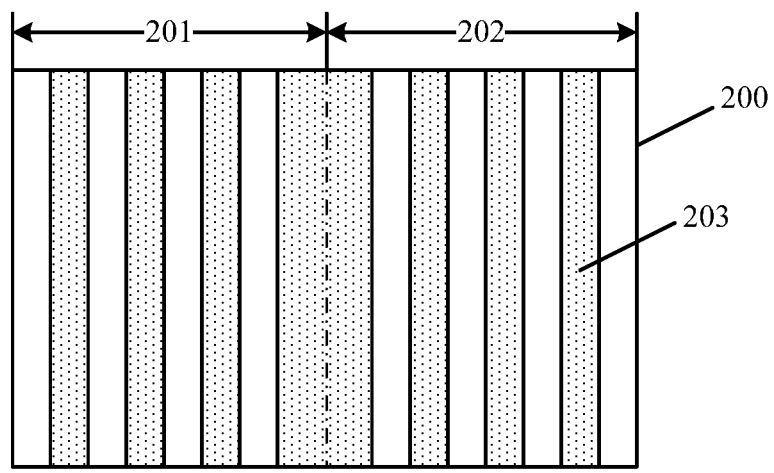
FIGS. 4-33 illustrate cross-sectional structures of an exemplary memory device structure corresponding to certain stages of a fabrication process in accordance with various embodiments of the disclosed subject matter.

Referring to FIG. 4, a substrate 200 may be provided. The substrate 200 may include a device region 201 and a peripheral region 202. The substrate 200 in the device region 201 may include a plurality of isolation structures 203. The substrate 200 between adjacent isolation structures 203 may include source regions.

The substrate 200 may be a silicon substrate, a silicon germanium substrate, a silicon carbide substrate, a silicon on isolator (SOI) substrate, a germanium on isolator (GOI) substrate, a glass substrate, or a Group III-V compound substrate such as Gallium Nitride, Gallium Arsenic, etc. The substrate 200 may be a silicon substrate in one embodiment.

The device region 201 may be used for forming memory cells of the memory device. In one embodiment, the device region 201 may be used for forming gate structures of the memory devices. The peripheral region 202 may be used for forming peripheral wirings of the memory devices. In one embodiment, the peripheral region 202 may be used as an electrical connection region for the word lines.

The isolation structures 203 may be used for isolating the adjacent active regions. The active regions in the substrate 200 may be doped with ions to form well regions. The doping ions in the well regions may have an opposite conductivity type to the doping ions in the source regions and the drain regions formed subsequently.

In one embodiment, the isolation structures 203 may be shallow trench isolation (STI) structures. The material of the isolation structures 203 may be any suitable isolation material including silicon oxide, silicon nitride, silicon hydroxide, or any combinations thereof. The surface of the isolation structures 203 may be higher or levelled with the surface of the substrate 200.

In one embodiment, the substrate 200 in the peripheral region 202 may also include a plurality of isolation structures 203. In addition, the top of the isolation structures 203 may be stripe-shaped, and the isolation structures 203 may be arranged in parallel.

Figure 5:
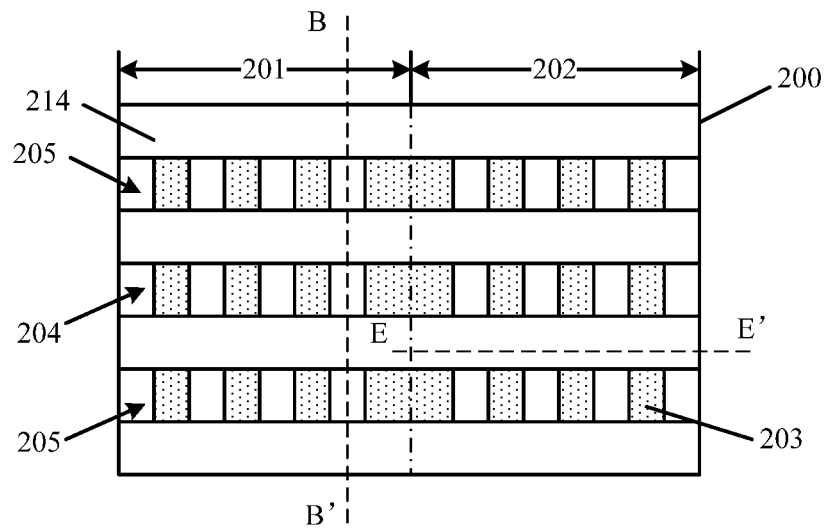
Figure 6:
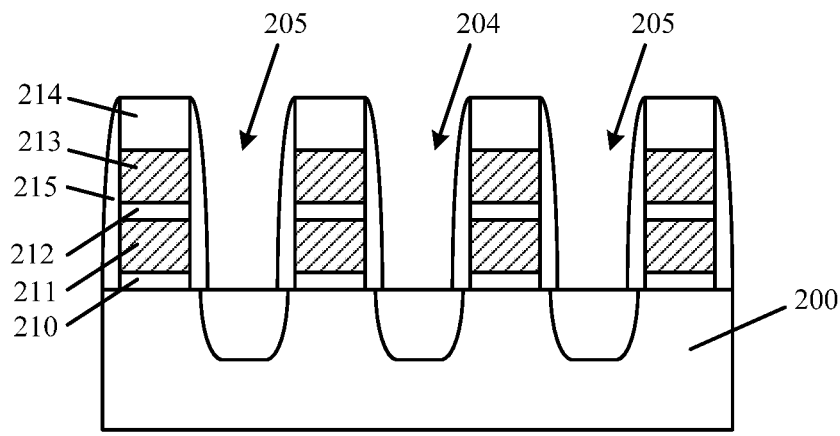
Figure 7:
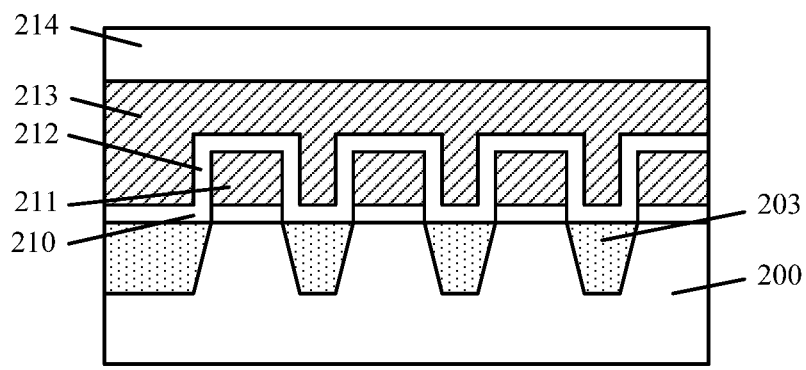

Referring to the FIGS. 5-7, FIG. 6 is a cross sectional view along a direction BB' of the memory device structure shown in FIG. 5. FIG. 7 is a cross sectional view along a direction of EE' of the memory device structure shown in FIG. 5. A plurality of gate structures extending from the device region 201 to the surface of the peripheral region 202 can be formed on the surface of the substrate 200. The gate structures may extend across the surfaces of the plurality of active regions. The two sides of the gate structures may have source region trenches 204 and drain region trenches 205. The bottom of the source region trenches 204 and the drain region trenches 205 may expose the surfaces of the active regions and the isolation structures 203 in the device region 201 and the peripheral regions 202. The active regions at the bottom of source region trenches 204 may include source regions. The active regions at the bottom of the drain region trenches 205 may include drain regions. The gate structures may include a controlling gate layer 213, and a first barrier layer 214 on the surface of the controlling gate layer 213.

In one embodiment, the gate structure may also include a first gate dielectric layer 210 on the surface of the active regions of the substrate 200. The gate structure may also include a floating gate layer 211 on the surface of the first gate dielectric layer 210. The gate structure may also include a second gate dielectric layer 212 on the surface of the floating gate layer 211 and the isolation structures 203. The controlling gate layer 213 may be located at the surface of the second gate dielectric layer 212.

In one embodiment, the gate structures may also include the first gate dielectric layer 210, the floating gate 211, the second gate dielectric layer 212, the controlling gate layer 213, and the side walls 215 on the side surface of the first barrier layer 214.

In one embodiment, the gate structures may be used for the NOR ETOX flash memory device.

The gate structures may be extended across the surface of the isolation structures 203. The gate structures may be located on the surface of at least two adjacent active regions of the substrates 200. The gate structure may also cover the surfaces of the isolation structures 203 between the adjacent active regions. In one embodiment, projections of the gate structures on the surface of the substrate 200 may be stripe-shaped. The projections of the gate structures on the surface of the substrate 200 may be perpendicular to the top patterns of the isolation structures 203.

Furthermore, the number of the gate structures may be at least one. When the number of the gate structure is greater than one, the gate structures may be arranged in parallel. The source region trenches 204 and the drain region trenches 205 can be formed between adjacent gate structures. The source region trenches 204 and the drain region trenches 205 may be arranged alternatively in parallel. As such, the two sides of each gate structure include a source region trench 204 and a drain region trench 205 respectively.

The material of the floating gate layer 211 and the controlling gate layer 213 may be polysilicon. In addition, the interior or the surface of the controlling gate layer 213 may include metal silicide material in order to reduce the resistance of the controlling gate layer 213. The metal silicide material may be formed by a self-aligned metal silicide process.

The material of the first gate dielectric layer 210 or the second gate dielectric layer 212 may be silicon oxide, silicon nitride, silicon hydroxide, or any combinations thereof. The material of the first barrier layer 214 is different from the material of the controlling gate layer 213, the material of the first dielectric layer, the material of the third dielectric layer, or the material of the contacting surface between the second dielectric layer and the first barrier layer 214. The material of first barrier layer 214 may be silicon oxide, silicon nitride, silicon hydroxide, amorphous carbon, metal or metal compound. In one embodiment, the material of the first barrier layer 214 may be silicon nitride.

In one embodiment, the material of the first gate dielectric layer 210 may be silicon oxide. The first gate dielectric layer 210 may be an erase through oxide (ETO) layer. The electrons can migrate between the trench region of the substrate 200 and the floating gate layer 211 through the first gate dielectric layer 210, so that the functions of writing, erasing, or reading can be executed.

The floating gate layer 211 may store electrons to achieve the data storage without external electrical power supply. The controlling gate layer 213 may be used to apply bias on the floating gate layer 211. The controlling gate layer 213 may use different bias to control the floating gate layer 211 to execute different operations such as writing, erasing, or reading . . . etc. The polysilicon material of the floating gate layer 211 or the controlling gate layer 213 may be doped with irons to adjust the resistance of the floating gate layer 211 or the controlling gate layer 213.

The second gate dielectric layer 212 may be used for isolating the floating gate layer 211 and the controlling gate layer 213. In one embodiment, the second gate dielectric layer 212 may be composed by a silicon oxide layer, a silicon nitride layer on the surface of the silicon oxide layer, and a silicon oxide layer on the surface of the silicon nitride layer. That is, the second gate dielectric layer 212 may have a silicon oxide-silicon nitride-silicon oxide (O—N—O)

structure. The O—N—O structure may have a good isolating ability, and also have a good binding capacity with the polysilicon material.

The method of forming the gate structure may include the following steps: forming a first gate dielectric film on the surface of the substrate 200; forming a first polysilicon film on the surface of the first gate dielectric film; using an anisotropic dry etching method to etch a part of the first polysilicon film and the first gate dielectric film until the isolation structures 203 and a part of the surface of the active regions are exposed to form a first gate dielectric layer 210 and a floating gate layer 211; forming a second gate dielectric film on the surfaces of the first gate dielectric layer 210 and the floating gate layer 211; forming a second polysilicon film on the surface of the second gate dielectric layer; planarizing the surface of the second polysilicon film; after planarizing the second polysilicon film, forming a first barrier layer 214 for defining the shapes and locations of the gate structures on the surface of the second polysilicon layer; using the first barrier layer 214 as a mask, and using the anisotropic dry etching method to etch the second polysilicon layer and the second gate dielectric layer until a part of the isolation structures 203 and the surface of the active regions are exposed to form a second gate dielectric layer 212 and a controlling gate layer 213.

The first barrier layer 214 may be used to protect the top surface of the controlling gate layer 213 in the subsequent fabricating processes, which may facilitate forming the source interconnecting line and the drain region plugs by using the self-aligned electrical interconnecting process.

After forming the second gate dielectric layer 212 and the controlling gate layer 213, and before forming multiple first side walls 215, an ion implantation process may be performed in the active regions of the substrate 200 to form a light doping region. The \dopants in the light doping region may be the same type of the dopants of the source region and the drain region formed subsequently. The light doping region may be used for restraining the diffusion of the dopants in the source region and the drain region, thereby restraining the leakage current.

The material of the first side walls 215 and the material of the first dielectric layer that is formed subsequently may be different. The first side walls 215 may protect the floating gate layer 211 and the controlling gate layer 213 after removing the first dielectric layer. In one embodiment, the material of the first side walls 215 may be silicon nitride. A method for forming the first side walls 215 may include the following steps: forming a first side wall film on the surfaces of the substrates 200, the isolation structures 203, the first gate dielectric layer 210, the floating gate layer 211, the second gate dielectric layer 212, the controlling gate layer 213, and the first barrier layer 214; and forming the first side walls 215 by etching the first side wall film until the surfaces of first barrier layer 214, the substrate 200, and the isolation structures 203 are exposed.

After forming the first side walls 215, source regions and drain regions may be formed in the active regions of the substrate 200 by using an ion implantation process. The source regions may be formed on the bottom of the source region trenches 204. The drain regions may be formed on the bottom of the drain region trenches 205.

In one embodiment, after forming the source regions and the drain regions, multiple second side walls may be formed on the surface of the first side walls 215. The second side walls may protect the first side walls 215 in the subsequent fabricating process. The material of the second side walls may be silicon nitride. The method for forming the second side walls may have the same process as the method for forming the first side walls 215.

Figure 8:
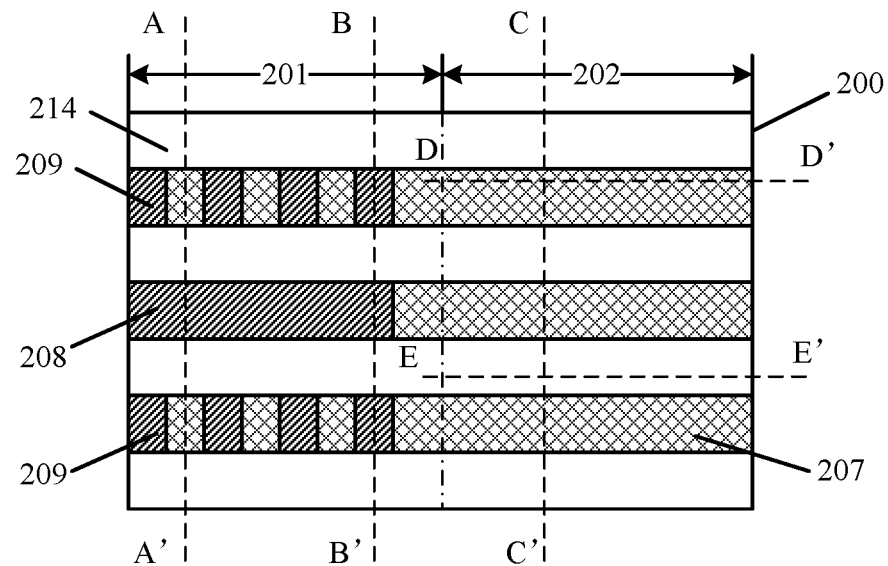

Referring to FIG. 8, the first dielectric layer (not show in the Figures), the second barrier layer 207, the source interconnecting line 208 and the drain region plugs 209 may be formed. The first dielectric layer may be located on the surface of the active regions and the isolation structures 203 as shown in FIG. 5. The second barrier layer 207 may be located on the surfaces of the isolation structures 203 that are in the drain region trenches 205 of the device region 201, as well as in the source region trenches 204 and the drain region trenches 205 of the peripheral region 202 as shown in FIG. 5. The source interconnecting line 208 may be located in the source region trenches 204 of the device region 201. The first drain region plugs 209 may be located on the surfaces of the drain regions of the device region 201.

In one embodiment, the method of forming the first dielectric layer, the second barrier layer 207, the source interconnecting line 208, and the first drain region plugs 209 may include the following steps: forming a first dielectric layer on the surface of the active regions and the isolation region 203, the surface of the first dielectric layer may be level with the surface of the gate structures; removing the portions of the first dielectric layer that are on the surface of the isolation structures 203 in the drain region trenches 205 of the device region 201, or in the drain region trenches 205 and the source region trenches 204 of the peripheral region 202, forming drain region via holes in the drain region trenches 205 of the device region 201, and exposing the drain region trenches 205 and the source region trenches 204 in the peripheral region 202; forming a second barrier layer 207 in drain region via holes, the drain region trenches 205 and the source region trenches 204 of the peripheral region 202; after forming the second barrier layer 207, removing the portions of the first dielectric layer in the drain region trenches 205 and the source region trenches 204; after removing the first dielectric layer in the drain region trenches 205 and the source region trenches 204, forming the first drain region plugs 209 on the surface of the active regions in the drain region trenches 205 of the device region 201, and forming the source interconnecting line 208 in the source region trenches 204 of the device region 201.

The method for forming the first dielectric layer may include the following steps: using a deposition process to form a first dielectric film on the surface of the active regions, the isolation structures 203, and the gate structures; planarizing the first dielectric film to form the first dielectric layer by using a chemical mechanical polishing process until the top surfaces of the gate structures are exposed. The material of the first dielectric layer may be different from the material of the first barrier layer 214. In one embodiment, the material of the first dielectric layer may be silicon oxide. The deposition process to form the first dielectric film may be fluid chemical vapor deposition (FCVD) process or high aspect ratio chemical vapor deposition (HARP CVD) process.

The material of the second barrier layer 207 may be different from the material of the first dielectric layer. In one embodiment, the material of the second barrier layer 207 may be silicon nitride. When the first dielectric layer in the source region trenches 204 and the drain region trenches 205 are removed in the subsequent processes, the first barrier layer may be used to protect the isolation structures 203 in the drain region trenches 205, and the source region trenches 204 and the drain region trenches 205 in the device region 201. In addition, the second barrier layer 207 may be used to isolate the first drain region plugs formed in the drain region trenches 205 in the device region 201 in the subsequently processes.

Because the second barrier layer 207 is formed on the surface of the isolation structures 203 in the drain region trenches 205, and on the surfaces of the source region trenches 204 and drain region trenches 205 in the peripheral region 202, and also because the first barrier layer 214 and the second barrier layer 207 may have higher etch selectivity over the first dielectric layer, before etching the first dielectric layer in the source region trenches 204 and the drain region trenches 205, a patterned layer completely exposing the device region 201 and the peripheral region 202 may be formed. The patterned layer may be a patterned photoresist layer, which may reduce the difficulty for forming the patterned layer, and may increase the accuracy for the locations and the shapes that exposed by the patterned layer.

The method for forming the first drain region plugs 209 and the source interconnecting line 208 may include the following steps: forming a conductive material film on the surfaces of the source region trenches 204, the drain region trenches 205, the first dielectric layer, the gate structures, and the second barrier layer 207; and planarizing the conductive material film until the surfaces of the first dielectric layer, the gate structures, and the second barrier layer 207 are exposed to form the first drain region plugs 209 and the source interconnecting line 208.

The forming process of the conductive material film may be chemical vapor deposition process, physical vapor deposition process, or atomic layer deposition process. The material of the conductive material film may be copper, tungsten, aluminum, and/or silver. The material of the conductive material film may also include titanium, tantalum, titanium nitride, tantalum nitride, or any combinations thereof. The method for planarizing the conductive material film may be chemical mechanical polishing process.

Figure 9:
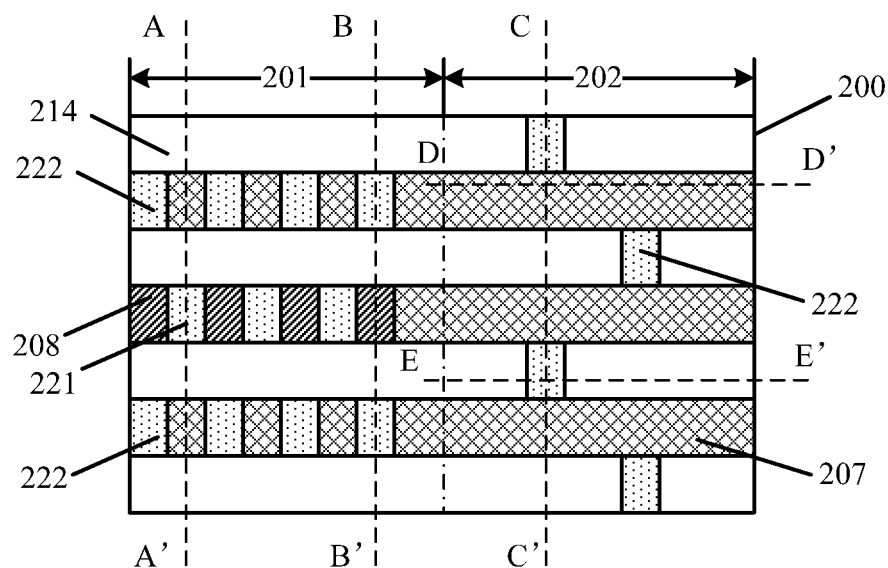
Figure 10:
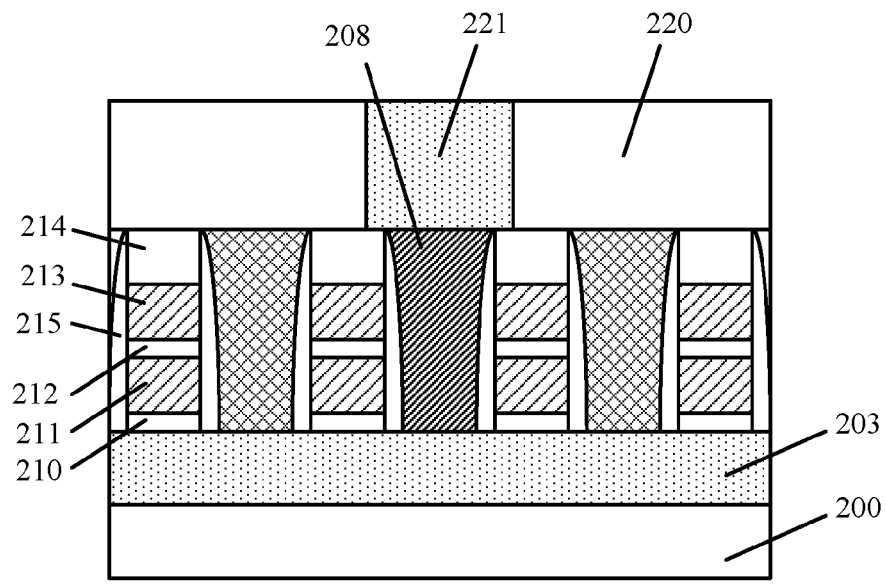
Figure 11:
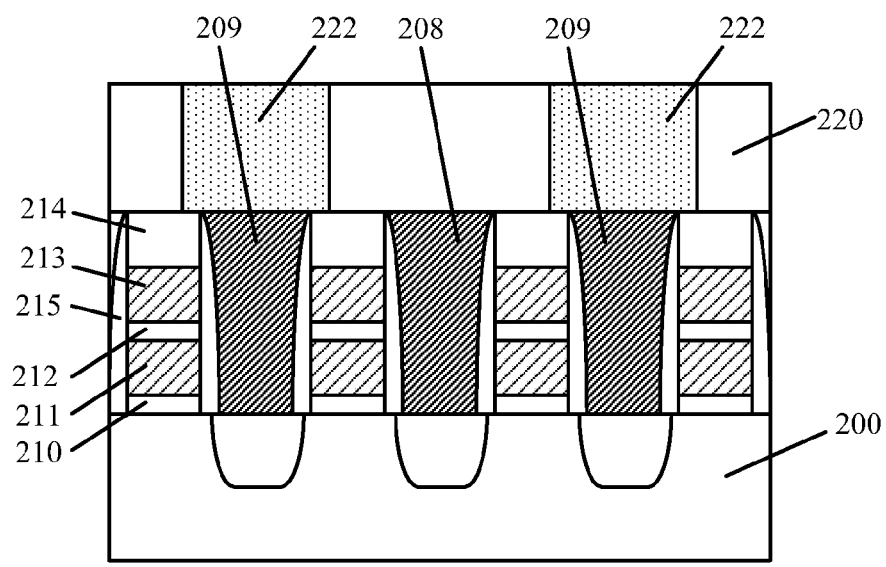
Figure 12:
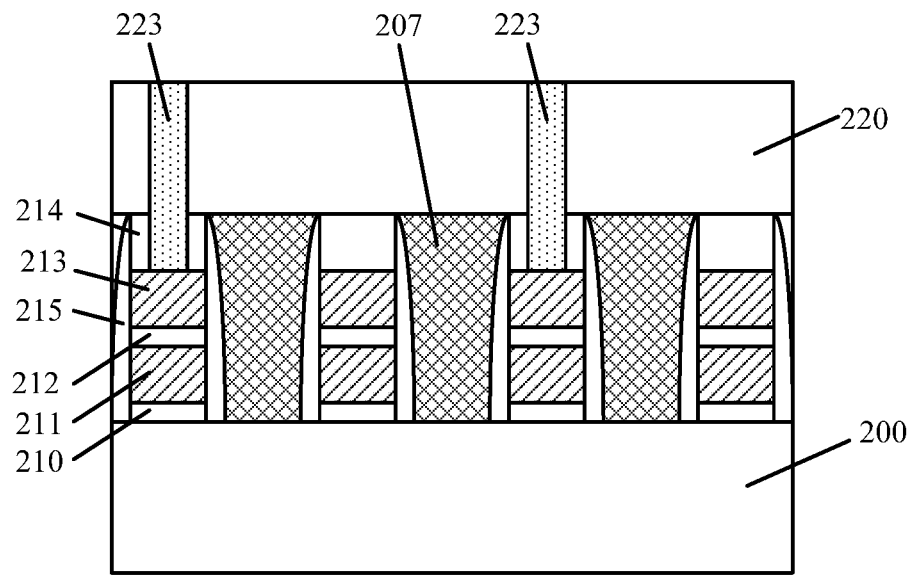
Figure 13:
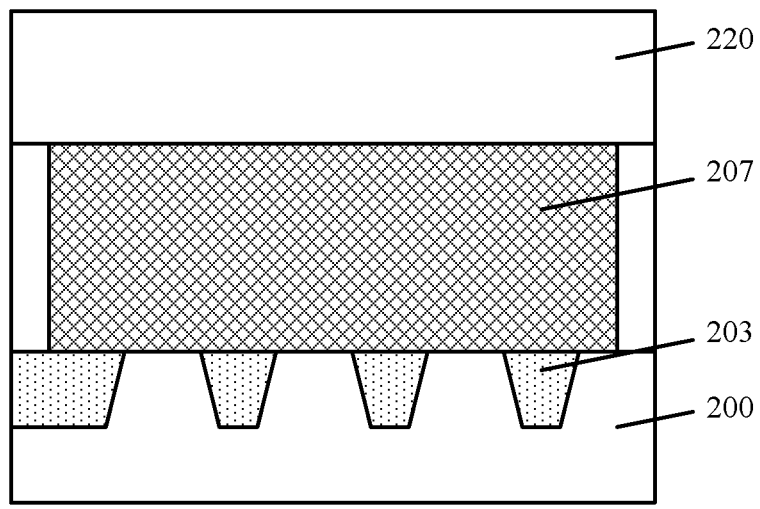
Figure 14:
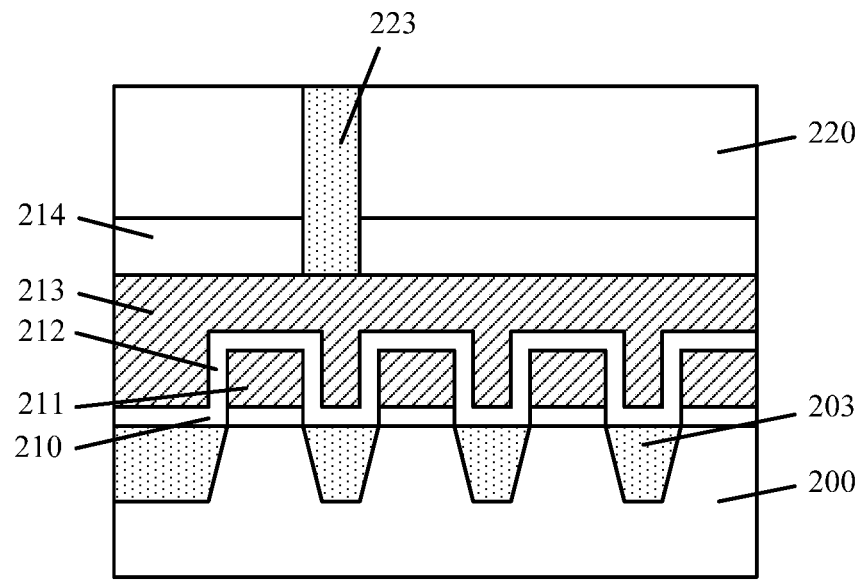

Referring to FIGS. 9 to 14, FIG. 10 is a cross sectional view along a direction of AA' of the memory device structure shown in FIG. 9, FIG. 11 is a cross sectional view along a direction of BB' of the memory device structure shown in FIG. 9, FIG. 12 is a cross sectional view along a direction of CC' of the memory device structure shown in FIG. 9, FIG. 13 is a cross sectional view along a direction of DD' of the memory device structure shown in FIG. 9, and FIG. 14 is a cross sectional view along a direction of EE' of the memory device structure shown in FIG. 9.

A second dielectric layer 220 may be formed on the surfaces of the first dielectric layer, the second barrier layer 207, the first drain region plugs 209, and the source interconnecting line 208. The second dielectric layer 220 in the device region 201 may include a plurality of the source line plugs 221 on the surface of the source interconnecting line 208, and a plurality of second drain region plugs 222 on top of the first drain region plugs 209. The second dielectric layer 220 and the first barrier layer 214 in the peripheral region 202 may include a plurality of controlling gate plugs 223 on the surface of the controlling gate layer 213.

It should be noted that FIG. 9 shows a top view of the memory device structure without showing the second dielectric layer 220. In other words, the second dielectric layer 220 is not shown in FIG. 9.

The locations of the source line plugs 221 may be corresponding to the locations of the isolation structures 203 on the bottom of the source region trenches 204. So that the source line plugs 221 and the second drain region plugs 222 on top of the adjacent drain region trenches 205 may be alternatively located, as shown in FIG. 5. Therefore, the distances between the source line plugs 221 and the second drain region plugs 222 may be increased to avoid the bridging effect.

The method for forming the source line plugs 221, the second drain region plugs 222, and the controlling gate plugs 223 may include the following steps: forming a plurality of first via holes in the second dielectric layer 220 to expose the surfaces of a portion of the source interconnecting line 208 in the device region 201, the first drain region plugs 209, and a portion of the first barrier layer 214 in the peripheral region 202; etching the portion of the first barrier layer 214 on the bottom of the first via holes in the peripheral region 202 until the surface of the controlling gate layer 213 is exposed, to form a plurality of controlling gate via holes in the peripheral region 202; fulfilling the first via holes in the device region 201 and the controlling gate via holes in the peripheral region 202 with conductive materials to form the source line plugs 221 and the second drain region plugs 222 in the device region 201, and to form the controlling gate plugs 223 in the peripheral regions 202.

The material for the second dielectric layer 220 may be silicon oxide. The process for forming the second dielectric layer 220 may be chemical vapor deposition process, physical vapor deposition process, or atomic layer deposition process, such as plasma enhanced chemical vapor deposition process (PECVD). In one embodiment, before forming the second dielectric layer 220, a first stop layer may be formed on the surfaces of the first dielectric layer, the second barrier layer 207, the first drain region plugs 209, and the source interconnecting line 208. The second dielectric layer 220 may be formed on the surface of the first stop layer. The first stop layer may be used as an etching stop layer during the etching process to form the first via holes. The material for the first stop layer may be silicon nitride or silicon oxynitride.

In one embodiment, a plurality of source line plugs 221 may be formed on the surface of one source interconnecting line 208. The plurality of source line plugs 221 formed on the surface of a same source interconnecting line 208 may be connected to the first conductive layer formed subsequently. So that the source line plugs 221 may have a larger contacting area with the first conductive layer, and the contacting resistance can be reduced. When applying voltage to source interconnecting line 208 through the first conductive layer, the voltage dropping can reduced, and the performance of the memory device structure can be increased. In some other embodiments, one source line plug 221 can be formed on the surface of one interconnecting line 208.

The method for forming the first via holes and the controlling gate via holes may include an anisotropic dry etching process. The conductive materials filled into the first via holes and the controlling gate via holes may include copper, tungsten, aluminum, and/or silver. The conductive materials may also include titanium, tantalum, titanium nitride, tantalum nitride, or any combinations thereof. The method for planarizing the conductive material film may be chemical mechanical polishing process. The process for filling the conductive materials may be chemical vapor deposition process, physical vapor deposition process, or atomic layer deposition process.

Figure 15:
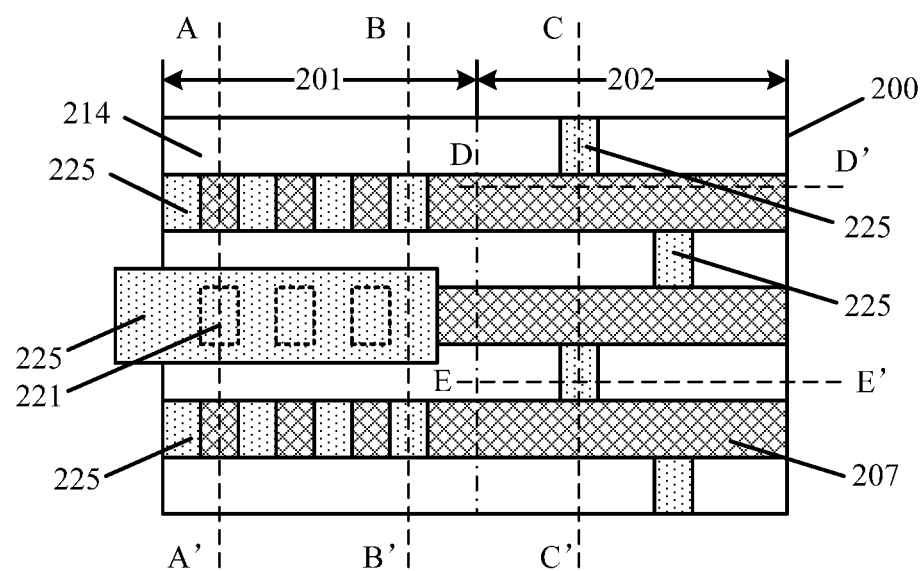
Figure 16:
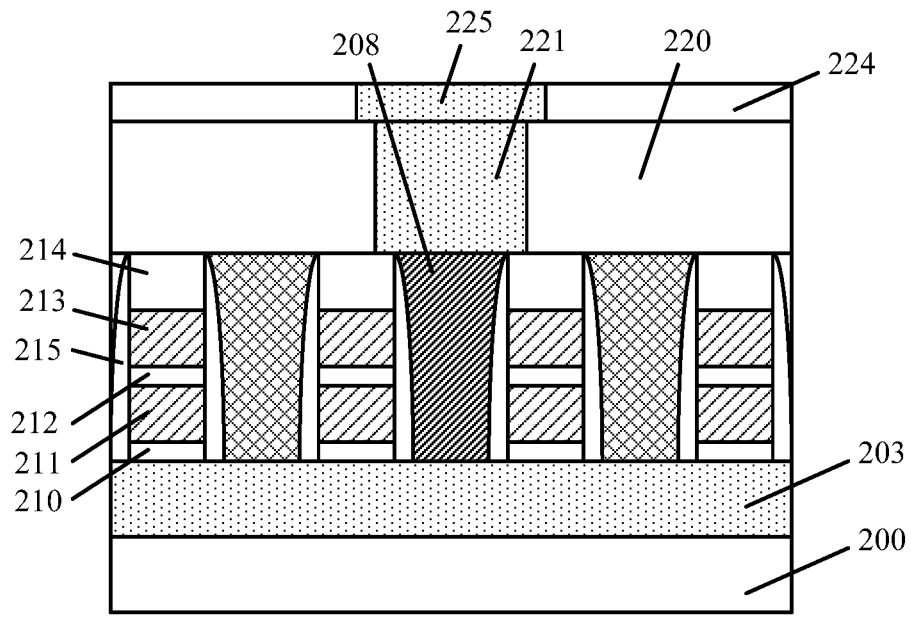
Figure 17:
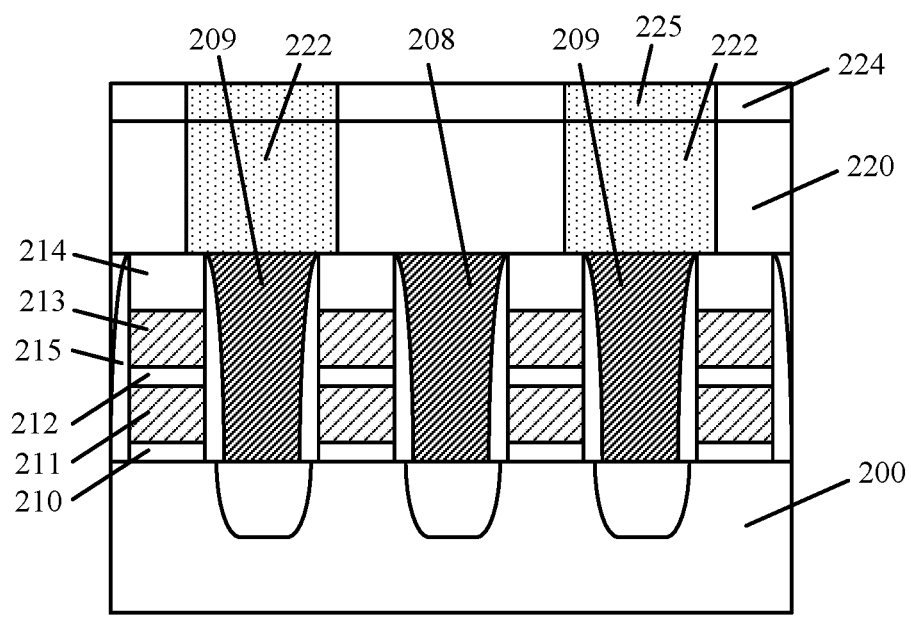
Figure 18:
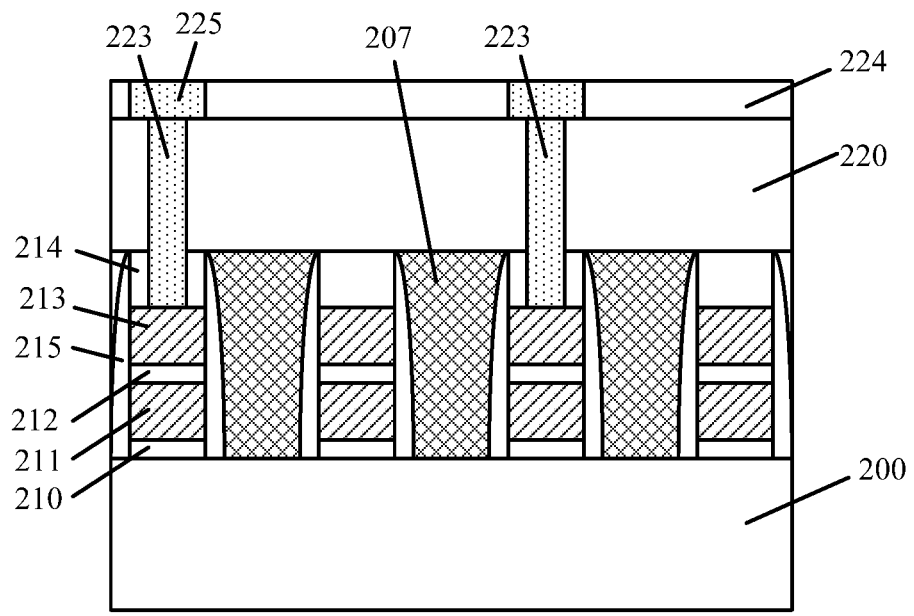
Figure 19:
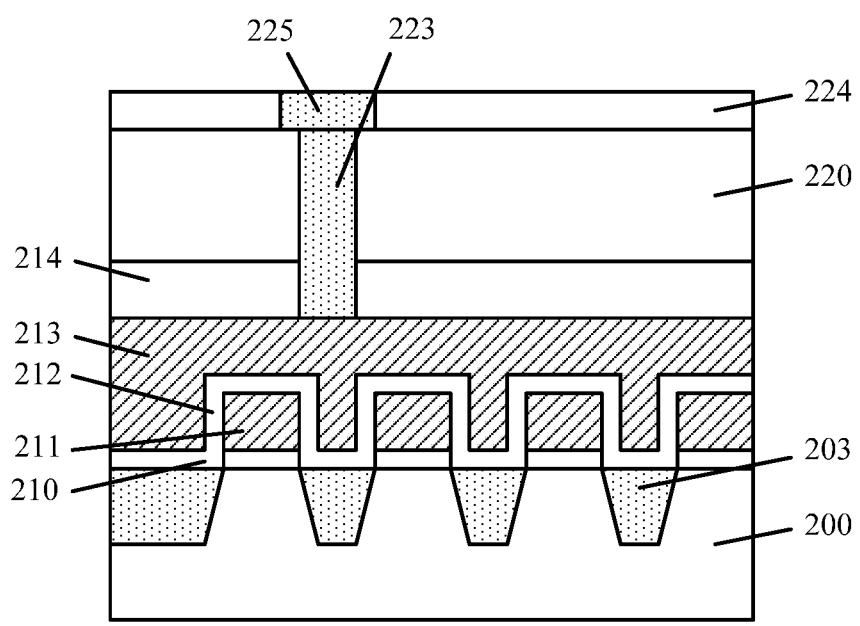

Referring to FIGS. 15 to 19, FIG. 16 is a cross sectional view along a direction of AA' of the memory device structure shown in FIG. 15, FIG. 17 is a cross sectional view along a direction of BB' of the memory device structure shown in FIG. 15, FIG. 18 is a cross sectional view along a direction of CC' of the memory device structure shown in FIG. 15, and FIG. 19 is a cross sectional view along a direction of EE' of the memory device structure shown in FIG. 15.

A third dielectric layer 224 may be formed on the surface of the second dielectric layer 220. The third dielectric layer 224 may include a plurality of first conductive layers 225 on top of the source line plugs 221, the second drain region plugs 222 and the controlling gate plugs 223. The plurality of source line plugs 221 on top of a same source interconnecting line 208 may be connected to a same first conductive layer 225.

It should be noted that FIG. 15 shows a top view of the memory device structure without showing the third dielectric layer 224. In other words, the third dielectric layer 224 is not shown in FIG. 15.

The material of the third dielectric layer 224 may be silicon oxide. The process for forming the third dielectric layer 224 may be chemical vapor deposition process, physical vapor deposition process, or atomic layer deposition process, such as plasma enhanced chemical vapor deposition process (PECVD). In one embodiment, before forming the third dielectric layer 224, a second stop layer may be formed on the surface of the second dielectric layer 220. The second stop layer may be used as an etching stop layer during the etching process for forming the first conductive layer 225. The material of the second stop layer may be silicon nitride.

The method for forming the first conductive layer 225 may include the following steps: forming a patterned photoresist layer on the surface of the third dielectric layer 224 to expose a portion of the surface of the third dielectric layer 224; using the patterned photoresist layer as a mask to etch the third dielectric layer 225 to form multiple first openings; forming a first conductive film on the surface of the third dielectric layer 224 and in the first openings; and planarizing the first conductive film until the surface of the third dielectric layer 224 is exposed to form the first conductive layer 225.

The material of the first conductive layer 225 may be copper, tungsten, aluminum, and/or silver. The material of the first conductive layer may also include titanium, tantalum, titanium nitride, tantalum nitride, or any combinations thereof. The process for forming the first conductive film may include chemical vapor deposition process, physical vapor deposition process, or atomic layer deposition process.

A plurality of parallel arranged first conductive layers 225 may be formed in the device region 201. The projections of the first conductive layers 225 in the device region 201 on the substrate 200 may be stripe-shaped. The first conductive layers 225 may be parallel to the source interconnecting lines 208. One first conductive layer 225 may be connected to one source interconnecting line 208 by a plurality of source line plugs 221. The one first conductive layer 225 may be used to apply voltage on the one source interconnecting line 208 that is connected to the one conductive layer 225. Therefore, the plurality of the first conductive layers 225 in the device region 201 may be used as source lines of the memory device structure.

Because the first conductive layers 224 and the source interconnecting lines 208 are connected by a plurality of source line plugs 221, the plurality of source line plugs 221 may have relatively large contact areas with the first conductive layers 225 or the source interconnecting line 208. So that the contacting resistance is relatively small, and the voltage loss during the voltage transmission from the first conductive layers 225 to the source interconnecting line 208 may be limited, thereby the voltage dropping problem can be avoided.

In addition, the first conductive layers 225 on the surface of the second drain region plugs 222 may be connected to the second conductive layers formed subsequently. The first conductive layers 225 on the surface of the controlling gate plugs 223 may be used to connect the third conductive layers formed subsequently.

Figure 20:
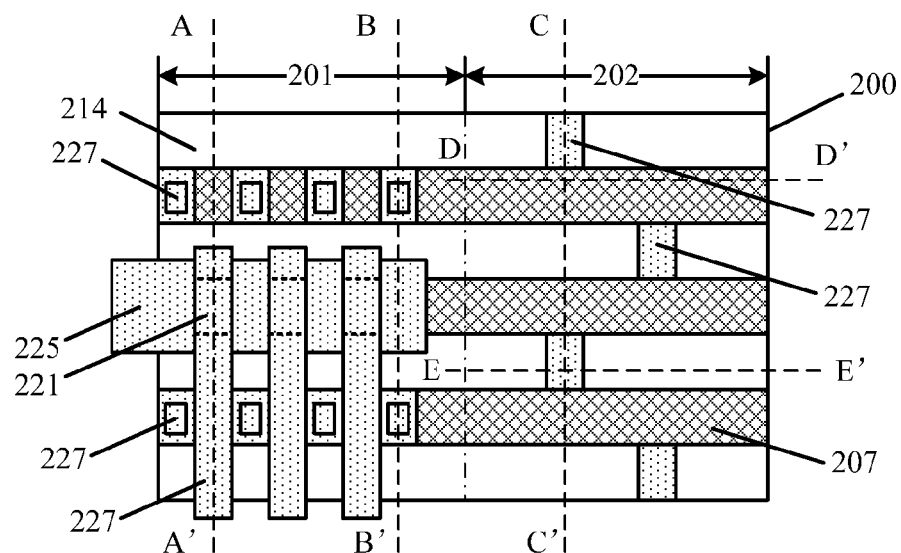
Figure 21:
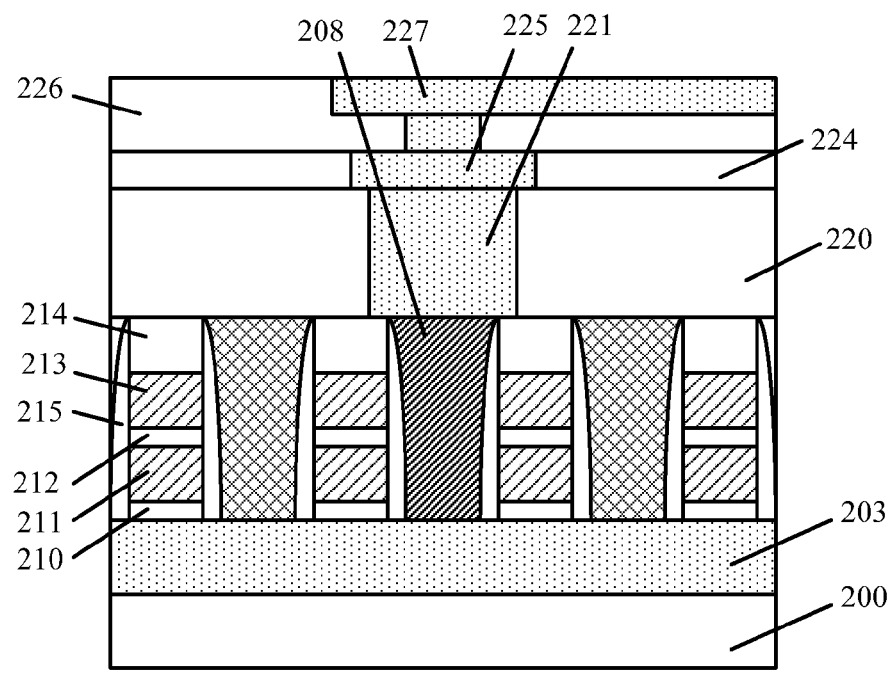
Figure 22:
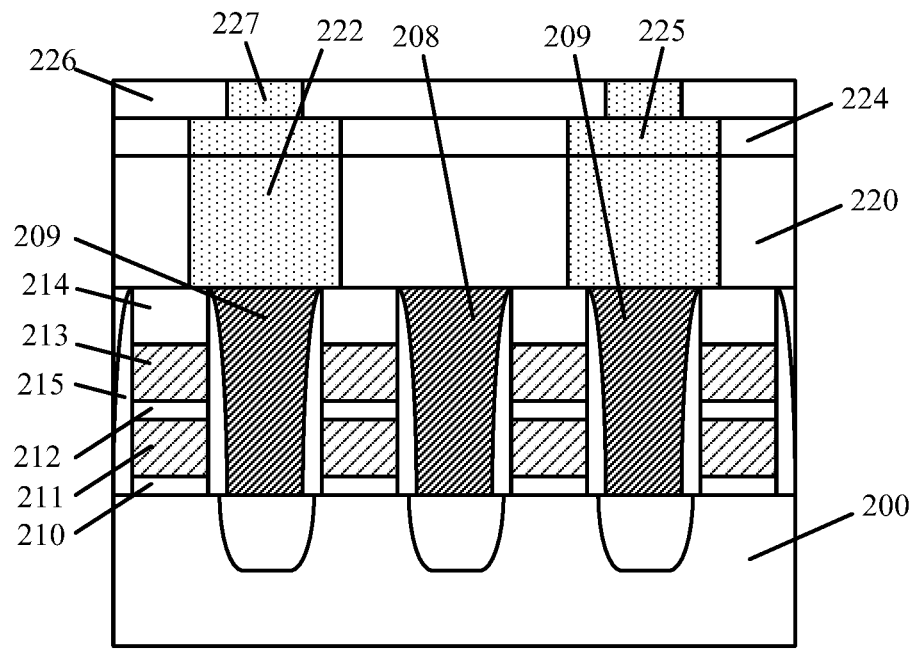
Figure 23:
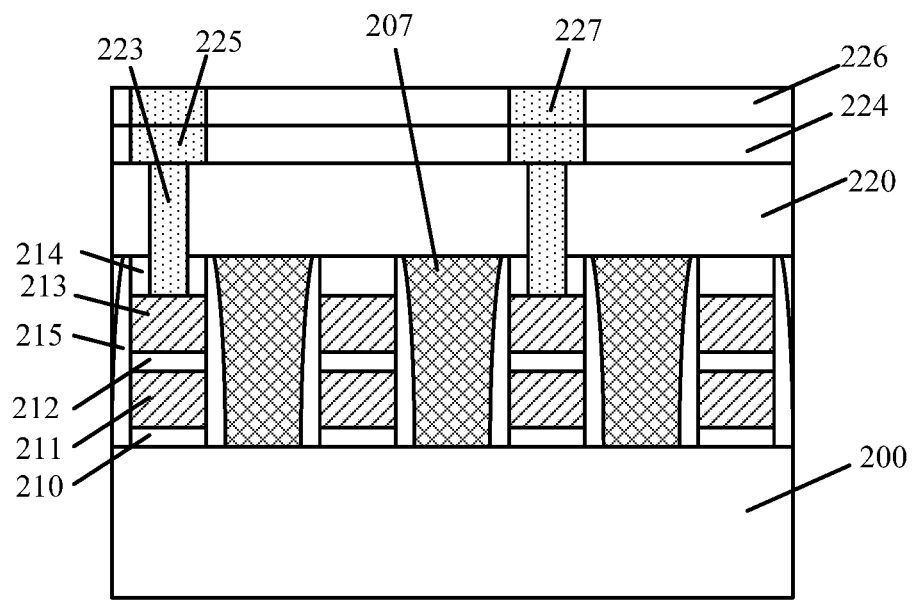
Figure 24:
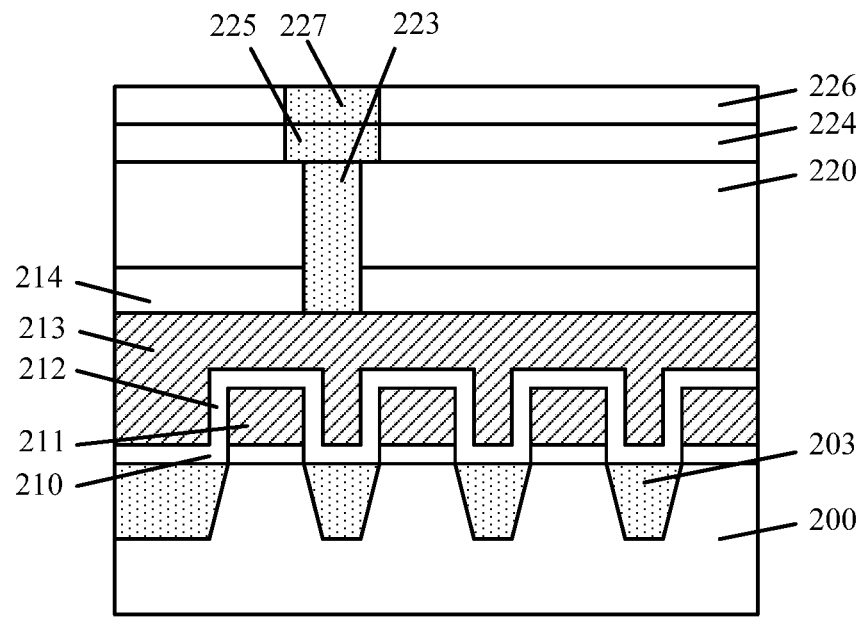

Referring to FIGS. 20 to 24, FIG. 21 is a cross sectional view along a direction of AA' of the memory device structure shown in FIG. 20, FIG. 22 is a cross sectional view along a direction of BB' of the memory device structure shown in FIG. 20, FIG. 23 is a cross sectional view along a direction of CC' of the memory device structure shown in FIG. 20, and FIG. 24 is a cross sectional view along a direction of EE' of the memory device structure shown in FIG. 20.

A fourth dielectric layer 226 may be formed on the surfaces of the third dielectric layer 224 and the first conductive layers 225. The fourth dielectric layer 226 may include a plurality of interconnecting structures 227 on the surface of the first conductive layers 225. The interconnecting structures 227 in the device region 201 may be connected to the adjacent source interconnecting line 208 by the first conductive layers 225 and the source line plugs 221.

It should be noted that FIG. 20 is a top view of the memory device structure without showing the third dielectric layer 224 and the fourth dielectric layer 226. In other words, the third dielectric layer 224 and the fourth dielectric layer 226 are not shown in FIG. 20.

In one embodiment, the interconnecting structures 227 may include interconnecting plugs on the surface of the first conductive layers 225, and interconnecting layers on the surface of the interconnecting plugs. The interconnecting layers in the device region 201 may be connected to the source line plugs 221 on the surface of the adjacent source interconnecting lines 205 by the interconnecting plugs.

The interconnecting structures 227 may be used to realize the electrical connection between adjacent first conductive layers 225 in the device region 201. Therefore a same voltage can be applied to the plurality of first conductive layers 225 in the device region 201. That is, a same voltage can be applied to the plurality of source interconnecting lines 208. Because the voltage dropping during the transmission from the first conductive layers 225 to the source interconnecting lines 208 is decreasing, the voltage differences among the plurality of source interconnecting lines 208 can be limited. Therefore, the formed memory device structure may have a good stability.

The material of the fourth dielectric layer 226 may be silicon oxide. The process for forming the fourth dielectric layer 226 may include chemical vapor deposition process, physical vapor deposition process, or atomic layer deposition process, such as plasma enhanced chemical vapor deposition (PECVD) process. In one embodiment, before forming the fourth dielectric layer 226, a third stop layer may be formed on the surface of the third dielectric layer 224. The third stop layer may be used as an etching stop layer during the etching process for forming the interconnecting structures 227. The material of the third stop layer may be silicon nitride.

The method for forming the interconnecting structures 227 may include the following steps: forming a patterned photoresist layer on the surface of the fourth dielectric layer 226 to expose a portion of the surface of the fourth dielectric layer 226; using the patterned photoresist layer as a mask, etching the fourth dielectric layer 226 to form second openings; forming an interconnecting film on the surface of the fourth dielectric layer 226 and in the second openings; planarizing the interconnecting film until the surface of the fourth dielectric layer 226 is exposed, to form the interconnecting structures 227.

In one embodiment, the second openings formed in the fourth dielectric layer 226 in the device region 201 may include interconnecting plug openings that expose the source line plugs 221 and the third dielectric layer 224, as well as interconnect layer openings that located on top of the interconnecting plug openings. The interconnecting film that formed in the interconnecting plug openings can form the interconnecting plugs, while the interconnecting film formed in the interconnecting layer openings can form the interconnecting layer.

The material of the interconnecting structures 227 may be copper, tungsten, aluminum, and/or silver. The material of the interconnecting structures 227 may also be titanium, tantalum, titanium nitride, tantalum nitride, or any combinations thereof. The process for forming the interconnect films may include chemical vapor deposition process, physical vapor deposition process, or atomic layer deposition process.

Figure 25:
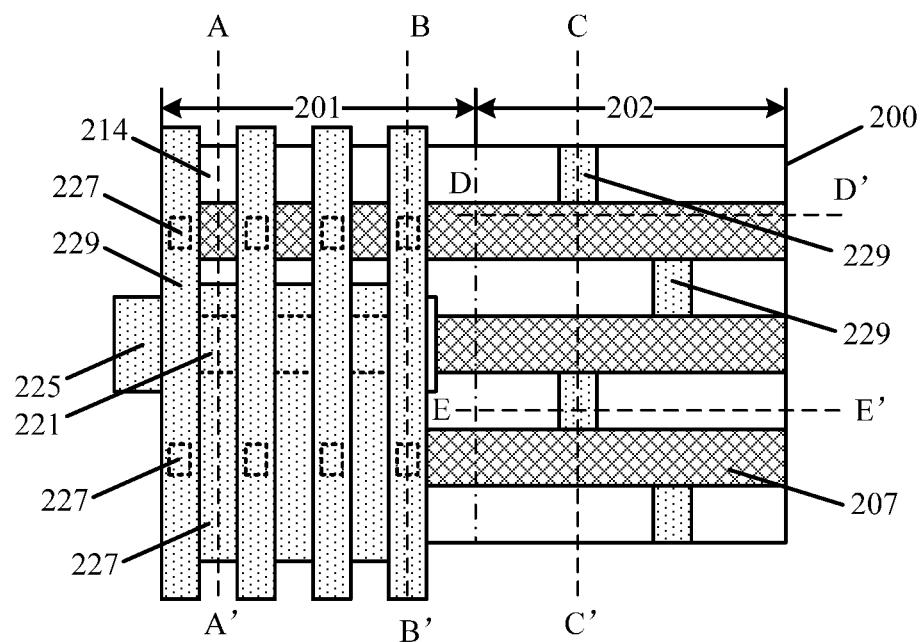
Figure 26:
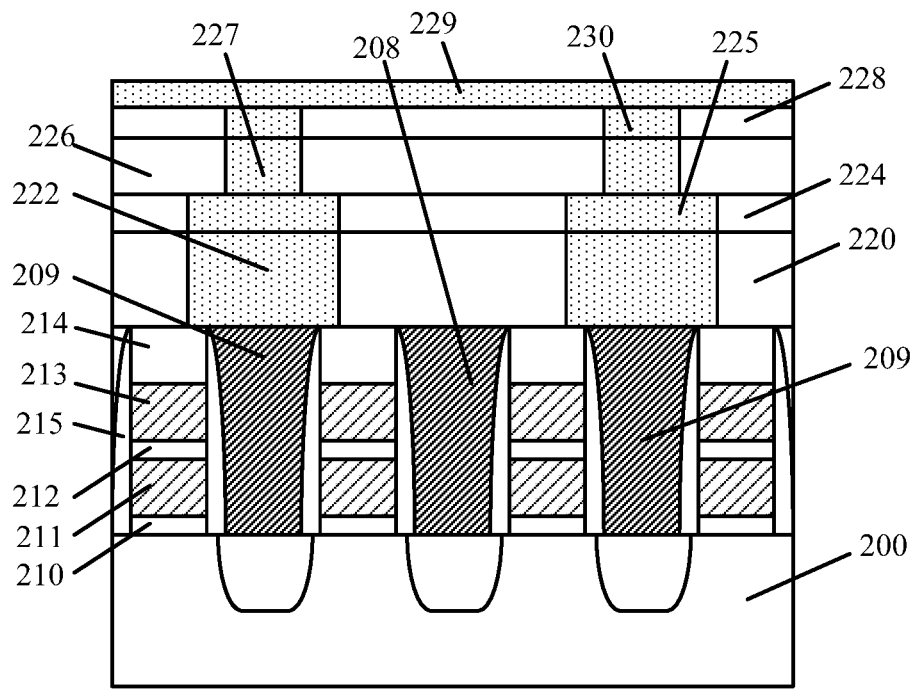
Figure 27:
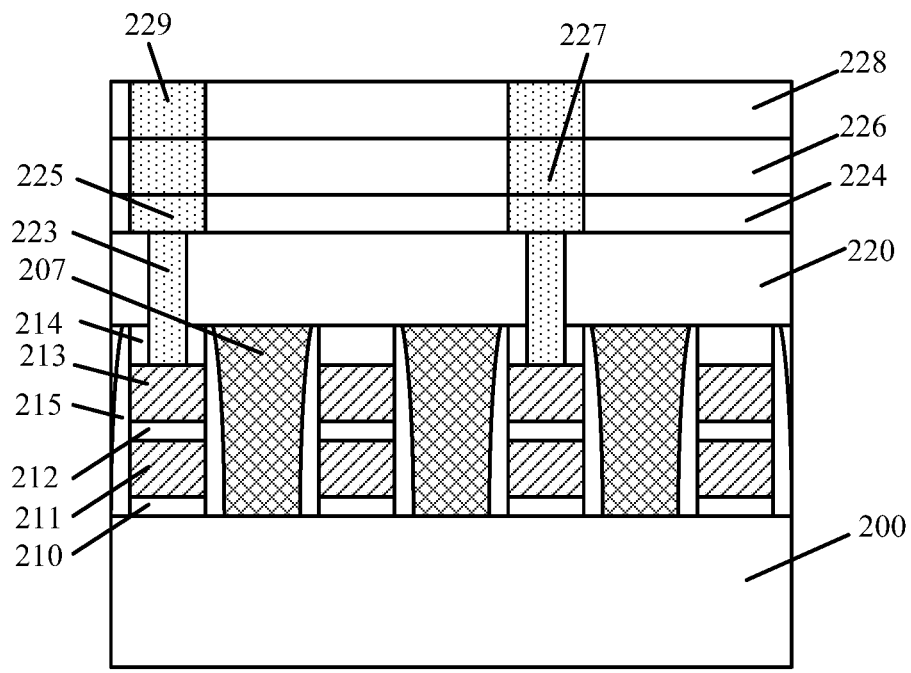
Figure 28:
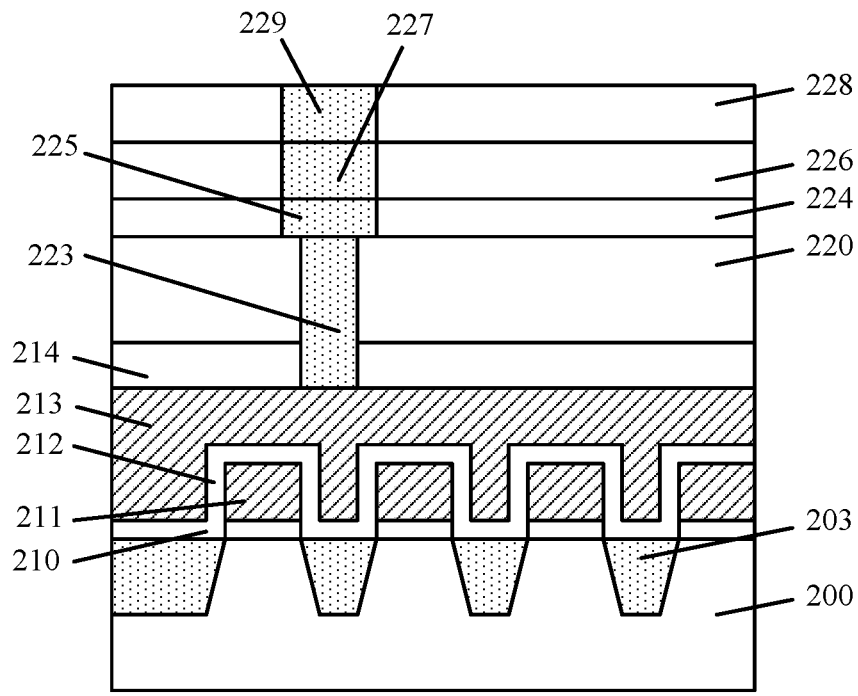

Referring to FIGS. 25 to 28, FIG. 26 is a cross sectional view along a direction of BB' of the memory device structure shown in FIG. 25, FIG. 27 is a cross sectional view along a direction of CC' of the memory device structure shown in FIG. 25, and FIG. 28 is a cross sectional view along a direction of EE' of the memory device structure shown in FIGS. 25.

A fifth dielectric layer 228 may be formed on the surface of the fourth dielectric layer 226 and interconnecting structures 227. The fifth dielectric layer 228 may include second conductive layers 229. The second conductive layers 229 in the device region 201 may be connected to the second drain region plugs 222 on top of the adjacent drain region trenches 205 by the interconnecting structures 227.

It should be noted that FIG. 25 is a top view of the memory device structure without showing the third dielectric layer 224, the fourth dielectric layer 226, and the fifth dielectric layer 228. In other words, the third dielectric layer 224, the fourth dielectric layer 226, and the fifth dielectric layer 228 are not shown in FIG. 25.

In one embodiment, the fifth dielectric layer 228 may further include multiple second plugs 230 on the surfaces of the interconnecting structures 227. The second conductive layers 229 may be located on the top surface of the second plugs 230. The second conductive layers 229 in the device region 201 may be connected to the second drain region plugs 222 on top of the drain region trenches 205 by the second plugs 230 and the interconnecting structures 227.

In one embodiment, the plurality of the conductive layers 229 in the device region 201 may be arranged in parallel. The second conductive layers 229 may be parallel to the shapes of the active regions. The second conductive layers 229 may be connected to the second drain region plugs 222 and the plurality of the first drain region plugs 209 on the surface of the same active region. The second conductive layers 229 may be electrically connected to the plurality of drain regions in the same active region. Therefore, one of the second conductive layers 229 may be used to apply voltage on the plurality of the drain regions in one of the active region. The second conductive layers 229 in the device region 201 may be used as bit lines of the memory device structure.

In addition, since the second conductive layers 229 may form in different layers with the interconnecting structures 227 or the first conductive layers 225, the occupied area of the memory device structure may be decreased, and the bridging effect due to the short distances between the bit lines and the source lines may be avoided. So that the integrality and the reliability of the memory device structure may be improved.

The material of the fifth dielectric layer 228 may be silicon oxide. The process for forming the fifth dielectric layer 228 may be chemical vapor deposition process, physical vapor deposition process, or atomic layer deposition process, such as plasma enhanced chemical vapor deposition (PECVD) process. In one embodiment, before forming the fifth dielectric layer 228, a fourth stop layer may be formed on the surface of the fourth dielectric layer 226. The fourth stop layer may be used as an etching stop layer during the etching process for forming the second conductive layers 229. The material of the fourth stop layer may be silicon nitride.

The method for forming the second conductive layers 229 may include the following steps: forming a patterned photoresist layer on the surface of the fifth dielectric layer 228 to expose the surface of a portion of the fifth dielectric layer 228; using the patterned photoresist layer as a mask, etching the fifth dielectric layer 228 to form third openings; forming a second conductive film on the surface of the fifth dielectric layer and in the third openings; planarizing the second conductive film until the surface of the fifth dielectric layer 228 is exposed, to form the second conductive layers 229.

In one embodiment, the third openings formed in the fifth dielectric layer 228 of the device region 201 may include second plug openings that expose a portion of the interconnecting structures 227, and second conductive layer openings located on top of the second plug openings. A portion of the second conductive film in the second plug openings can form second plugs 230, while another portion of the second conductive film in the second conductive layer openings can form the second conductive layers.

The material of the second conductive layers 229 may include copper, tungsten, aluminum, and/or silver. The material of the second conductive layers 229 may also include titanium, tantalum, titanium nitride, tantalum nitride, or any combinations thereof. The process for forming the second conductive layer may be chemical vapor deposition process, physical vapor deposition process, or atomic layer deposition process.

Figure 29:
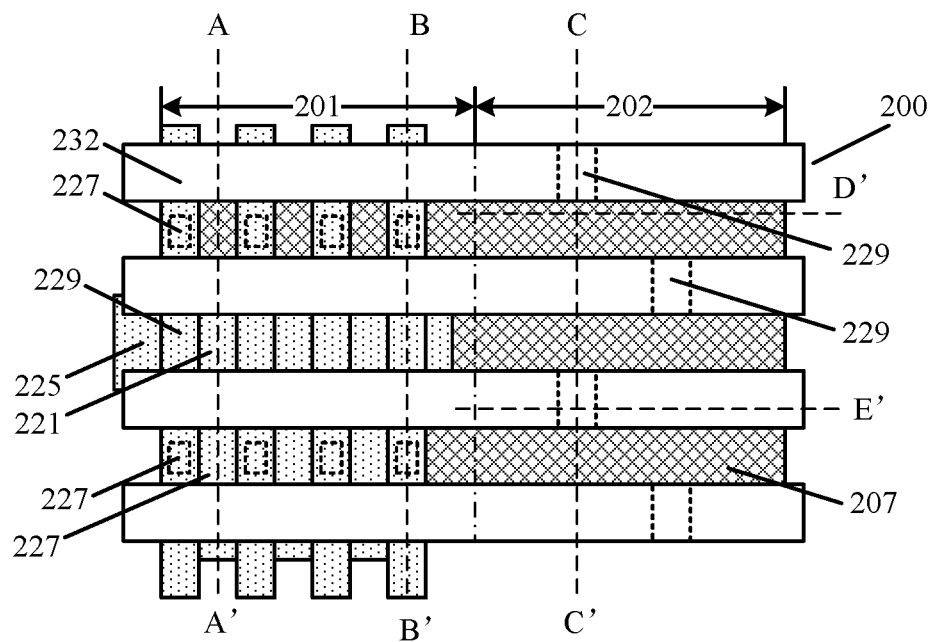
Figure 30:
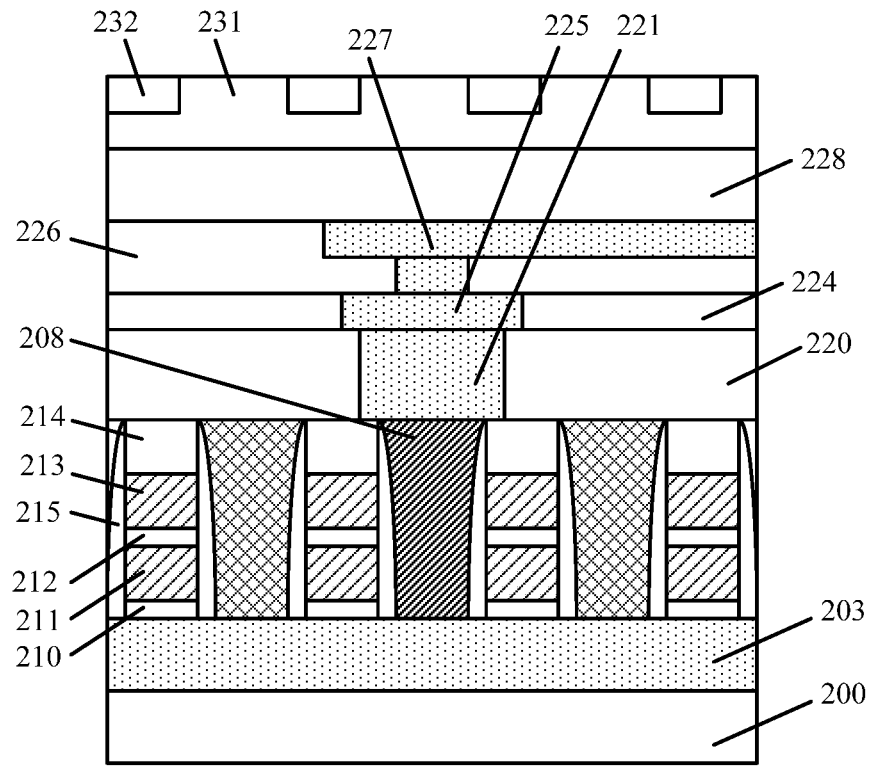
Figure 31:
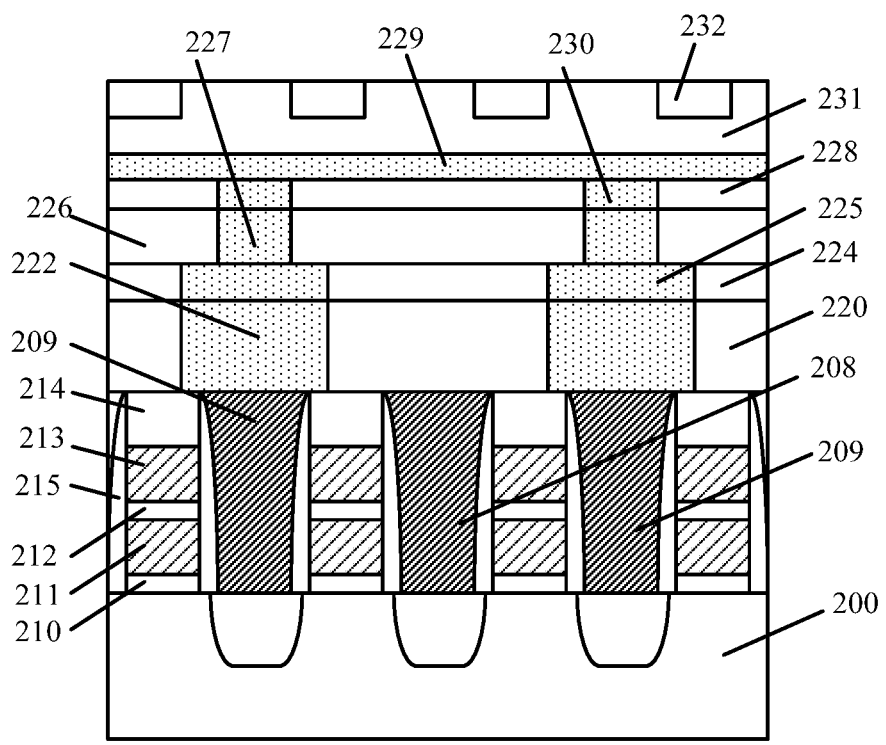
Figure 32:
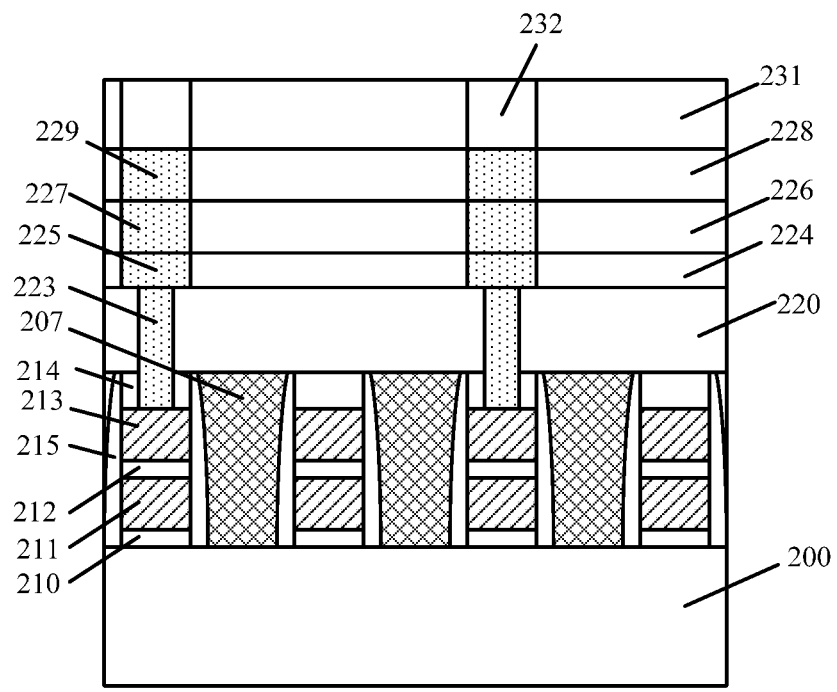
Figure 33:
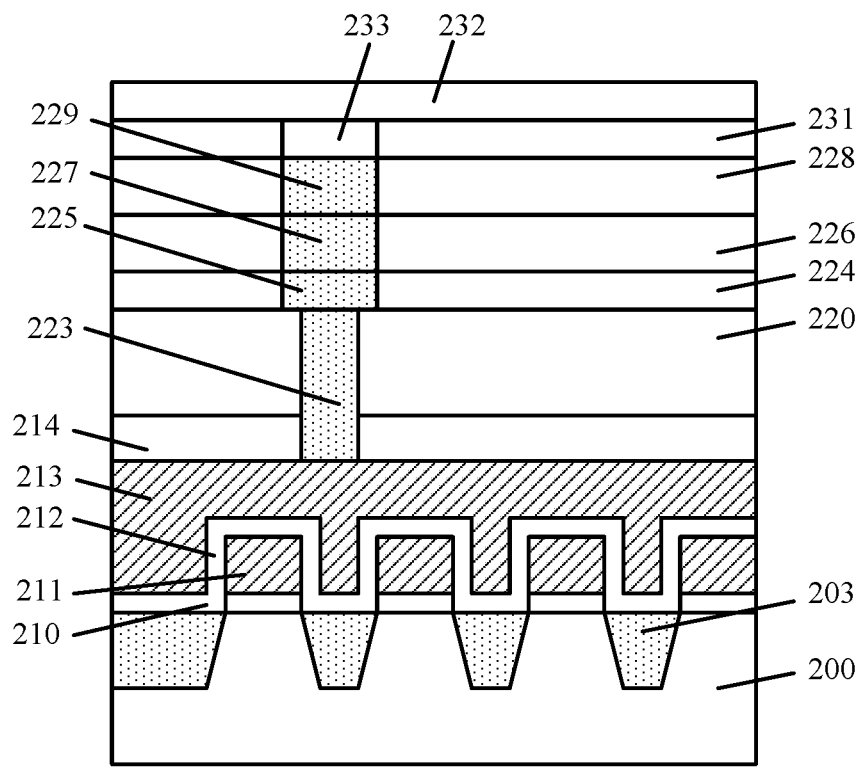

Referring to FIGS. 29 to 33, FIG. 30 is a cross sectional view along a direction of AA' of the memory device structure shown in FIG. 29, FIG. 31 is a cross sectional view along a direction of BB' of the memory device structure shown in FIG. 29, FIG. 30 is a cross sectional view along a direction of CC' of the memory device structure shown in FIG. 29, and FIG. 33 is a cross sectional view along a direction of EE' of the memory device structure shown in FIG. 29.

The sixth dielectric layer 231 may be formed on the surface of the fifth dielectric layer 228 and the second conductive layers 229. The sixth dielectric layer 231 may include a plurality of third conductive layers 232. The sixth dielectric layer 231 may be connected to the plurality of the controlling gate plugs 223 in the peripheral region 202 through the second conductive layers 229 and the interconnecting structures 227.

It should be noted that FIG. 25 is a top view of the memory device structure without showing the third dielectric layer 224, the fourth dielectric layer 226, the fifth dielectric layer 228, and the sixth dielectric layer 231. In other words, the third dielectric layer 224, the fourth dielectric layer 226, the fifth dielectric layer 228, and the sixth dielectric layer 231 are not shown in FIG. 25.

In one embodiment, the sixth dielectric layer may further include the third plugs 233 in the sixth dielectric layer 231. The third plugs 233 may be on the surfaces of the second conductive layers 229. The third conductive layers 232 may be on the surface of the top of the third plugs 233. The third conductive layers 232 may be connected to the plurality of controlling gate plugs 223 in the peripheral region 202 through the third plugs 233, the second conductive layers, and the interconnecting structures 227. The third conductive layers 232 may be used as word lines of the memory device structure.

The material of the sixth dielectric layer 231 may be silicon oxide. The process for forming the sixth dielectric layer 231 may be chemical vapor deposition process, physical vapor deposition process, or atomic layer deposition process, such as plasma enhanced chemical vapor deposition (PECVD) process. In one embodiment, before forming the sixth dielectric layer 231, a fifth stop layer may be formed on the surface of the fifth dielectric layer 228. The fifth stop layer may be used as an etching stop layer during the etching process for forming the third conductive layers 232. The material of the fifth stop layer may be silicon nitride.

The method for forming the third conductive layer 232 may include the following steps: forming a patterned photoresist pattern on the surface of the sixth dielectric layer 231 to expose the surface of a portion of the sixth dielectric layer 231; using the patterned photoresist layer as a mask, etching the sixth dielectric layer 231 to form fourth openings; forming a third conductive film on the surface of the sixth dielectric layer 231 and in the fourth openings; planarizing the third conductive film until the surface of the sixth dielectric layer 231 is exposed, to form the third conductive layers 232.

The material of the third conductive layer 232 may include copper, tungsten, aluminum, and silver. The material of the third conductive layer 232 may also include titanium, tantalum, titanium nitride, tantalum nitride, or any combinations thereof. The process for forming the third conductive film may be chemical vapor deposition process, physical vapor deposition process, or atomic layer deposition process.

In corresponding to some embodiments of the disclosed subject matter, a memory device structure formed by the above described method is provided. Referring to FIGS. 29-33, the memory device structure may include the following components.

The memory device structure may include a substrate 200, including a device region 201 and a peripheral region 202. The device region 201 of substrate 200 may include a plurality of isolation structures 203. Multiple active regions may be included in the substrate 200 between adjacent isolation structures 203.

The memory device structure may include a plurality of gate structures located on the surface of the substrate 200 extending from the device region 201 to the surface of the peripheral region 202. The gate structures may extend across the surfaces of a plurality of active regions. Multiple source region trenches 204 and drain region trenches 205 are located on both sides of the gate structures. The bottom of the source region trenches 204 and drain region trenches 205 may expose the surfaces of the active regions and the isolation structures 203 in the device region 201 and the peripheral region 203. The active regions at the bottom of the source region trenches 204 may include source regions. The active regions at the bottom of the drain region trenches 205 may include drain regions. The gate structures may include a gate controlling layer 213, and a first barrier layer 214 on the surface of the controlling gate layer 213.

The memory device structure may include a first dielectric layer, a second barrier layer 207, multiple source interconnecting lines 208, and multiple first drain region plugs 209. The first dielectric layer may be located on the surfaces of the active regions and the isolation structures 203. The second barrier layer 207 may be located on the surfaces of the isolation structures 203 in the drain region trenches 205 in the device region 201, as well as in the source region trenches 204 and the drain region trenches 205 in the peripheral region 202. The source interconnecting lines 208 may be located in the source region trenches 204 in the device region 201. The first drain region plugs 209 may be located on the surface of the drain regions in the device region 201.

The memory device structure may include a first dielectric layer, a second barrier layer 207, a second dielectric layer 220 on the surfaces of the first drain region plugs 209 and the source interconnecting lines 208. The second dielectric layer 220 in the device region 201 may include a plurality of source line plugs 221 on the surfaces of the source interconnecting lines 208, and multiple second drain region plugs 222 on top of the first drain region plugs 209. In the second dielectric layer 220 in the peripheral region 202 and the first barrier layer 214, a plurality of controlling gate plugs 223 is located on the surface of the controlling gate layer 213.

The memory device structure may include a third dielectric layer 224 located on the surface of the second dielectric layer 220. The third dielectric layer 224 may include a plurality of first conductive layers 225 on top of the source line plugs 221, the second drain region plugs 222 and the controlling gate plugs 223. A plurality of the source line plugs 221 on top of a same source interconnecting line 205 may be connected to a same first conductive layer 225.

The memory device structure may include a fourth dielectric layer 226 located on the surfaces of the third dielectric layer 224 and the first conductive layers 225. The fourth dielectric layer 226 may include a plurality of interconnecting structures 227 on the surfaces of the first conductive layers 225. The interconnecting structures 227 in the device region 201 may be connected to an adjacent source interconnecting line 208 by the first conductive layers 225 and the source line plugs 221.

The memory device structure may include a fifth dielectric layer 228 located on the surfaces of the fourth dielectric layer 226 and the interconnecting structures 227. The fifth dielectric layer 228 may include multiple second conductive layers 229. The second conductive layers 229 in the device region 201 may be connected to the second drain region plugs 222 on top of the adjacent drain region trenches 205 by the interconnecting structures 227.

The memory device structure may include a sixth dielectric layer 231 located on the surface of the fifth dielectric layer 228 and the second conductive layer 229. The sixth dielectric layer may include a plurality of the third conductive layers 232. The third conductive layers 232 may be connected to the plurality of the controlling gate plugs 223 in the surrounding area 202 by the second conductive layer 220 and the interconnecting structures 227.

More details about the above described structures may be provided in the following.

The gate structures may further include a first gate dielectric layer 210 on the surfaces of the active regions of the substrate 200, a second gate dielectric layer 212 on the surfaces of the floating gate layer 211 and the isolation structures 203. The controlling gate layer 213 may be located on the surface of the second gate dielectric layer 212.

The gate structures may also include sidewalls 215 on the side surfaces of the first gate dielectric layer 210, the floating gate layer 211, the second gate dielectric layer 212, the controlling gate layer 213, and the first barrier layer 214.

The interconnecting structures 227 may include multiple interconnecting plugs on the surfaces of the first conductive layers 225, and multiple interconnecting layers on the surfaces of the interconnecting plugs. The interconnecting layers in the device region 201 may be connected to the source line plugs 221 on the surfaces of the adjacent source interconnecting lines 208 through the interconnecting plugs.

The interconnecting structures 227 may also include multiple second plugs 230 in the fifth dielectric layer 228. The second plugs 230 may be located at the surfaces of the interconnecting structures 227. The second conductive layers 229 may be located on top surfaces of the second plugs 230. The second conductive layers 229 in the device region 201 may be connected to the second drain region plugs 222 on top of the adjacent drain region trenches 205 through the second plugs 230 and the interconnecting structures 227.

The interconnecting structure 227 may also include multiple third plugs 223 in the sixth dielectric layer 231. The third plugs 233 may be located on the surfaces of the second conductive layers 229. The third conductive layers 232 may be located on the top surfaces of the third plugs 233. The third conductive layers 232 may be connected to the plurality of the controlling gate plugs 223 in the peripheral region 202 through the third plugs 233, the second conductive layers 229, and the interconnecting structures 227.

The material of the first dielectric layer may be different from the material of the second barrier layer 207. In one embodiment, the material of the first dielectric layer may be silicon oxide. The material of the second barrier layer may be silicon nitride.

The locations of the source line plugs 221 may correspond to the locations of the isolation structures 203 on the bottom of the source region trenches 204.

Although the present invention is disclosed above with various disclosed embodiments, the present invention is not limited thereto. Anyone skilled in the art may make various changes and modifications without departing from the spirit and scope of the present invention. Therefore the scope of the present invention should be defined by the claims thereof.

What is claimed is:

1. A method for forming a memory device structure, comprising:
   providing a substrate including a peripheral region and a device region including a plurality of isolation structures, wherein the substrate between adjacent isolation structures includes active regions;
   forming a plurality of gate structures on the surface of the substrate, wherein a plurality of source region trenches and a plurality of drain region trenches are located on two sides of the gate structures respectively, a plurality of source regions are located in the active regions at the bottom of the source region trenches, a plurality of drain regions are located in the active regions at the bottom of the drain region trenches, and the gate structures include a plurality of controlling gate layers, and a first barrier layer on the surfaces of the controlling gate layers;
   forming a first dielectric layer, a second barrier layer, a plurality of source interconnecting lines, and a plurality of drain region plugs, wherein the source interconnecting line are located in the source region trenches in the device region, and the first drain region plugs are located on the surfaces of the drain regions in the device region;
   forming a second dielectric layer on the surfaces of the first dielectric layer, the second barrier layer, the first drain region plugs, and the source interconnecting lines, wherein the second dielectric layer in the device region include a plurality of source line plugs on the surfaces of the source interconnecting lines, and a plurality of second drain region plugs on the first drain region plugs, and the second dielectric layer and the first barrier layer in the peripheral region include a plurality of controlling gate plugs on the surfaces of the controlling gate layers;
   forming a third dielectric layer on the surface of the second dielectric layer, wherein the third dielectric layer includes a plurality of first conductive layers on the source line plugs, the second drain region plugs, and the controlling gate plugs;
   forming a fourth dielectric layer on the third dielectric layer and the first conductive layers, wherein the fourth dielectric layer includes a plurality of interconnecting structures on the surfaces of the first conductive layers;
   forming a fifth dielectric layer on the surfaces of the fourth dielectric layer and the interconnecting structures, wherein the fifth dielectric layer includes a plurality of second conductive layers; and
   forming a sixth dielectric layer on the surfaces of the fifth dielectric layer and the second conductive layers, wherein the sixth dielectric layer includes a plurality of third conductive layers.

2. The method of claim 1, wherein:
   the gate structures extend from the device region to the surface of the peripheral region and extend cross the surfaces of the active regions;
   the bottom portions of the source region trenches and the drain region trenches expose the surfaces of the active regions and the isolation structures in the device region and the peripheral region;
   the first dielectric layer is located on the surfaces of the active regions and the isolation structures, the second barrier layer is located on the surfaces of the isolation structures in the device region trenches, and in the drain region trenches and the source region trenches in the peripheral region;
   the source line plugs on top of a same source interconnecting line are connected to a same first conductive layer;
   the interconnecting structures in the device region are connected to corresponding adjacent source interconnecting lines through the first conductive layers and the source line plugs;
   the second conductive layers in the device region are connected to the second drain region plugs that are located on top of the adjacent drain region trenches through the interconnecting structures; and
   the third conductive layers are connected to the controlling gate plugs in the peripheral region through the second conductive layers and the interconnecting structures.

3. The method of claim 1, further comprising a method for forming the first dielectric layer, the second barrier layer, the source interconnecting lines and the first drain region plugs, including:
   forming the first dielectric layer on the surfaces of the source regions and the isolation structures, wherein the surface of the first dielectric layer levels with the surface of gate structures;
   removing the first dielectric layer on the surfaces of the drain region trenches in the device region to form a plurality of drain region via holes in the drain region trenches, and removing the first dielectric layer in the drain region trenches and the source region trenches that are in the peripheral region to expose the drain region trenches and the source region trenches that are in the peripheral region;
   forming a second barrier layer in the drain region via holes, and in the drain region trenches and the source region trenches that are in the peripheral region;
   after forming the second barrier layer, removing the first dielectric layer in the source region trenches and the drain region trenches; and
   after removing the first dielectric layer in the source region trenches and the drain region trenches, forming a plurality of first drain region plugs on the surfaces of the active regions in the drain region trenches in the device region, and forming a plurality of source interconnecting lines in the source region trenches in the device region.

4. The method of claim 3, further comprising a method for forming the first drain region plugs and the source interconnecting lines, including:
   forming a conductive material film on the surfaces of the source region trenches, the drain region trenches, the first dielectric layer, the gate structures, and the second barrier later; and
   planarizing the conductive material film until the surfaces of the first dielectric layer, the gate structures, and the second barrier layer are exposed, to form the first drain region plugs and the source interconnecting lines.

5. The method of claim 1, wherein the gate structures further comprises:
   a first gate dielectric layer on the surfaces of the source regions of the substrate;
   a floating gate layer on the surface of the first gate dielectric layer; and
   a second gate dielectric layer on the surface of the floating gate layer and the isolation structures;
   wherein the controlling gate layers are located on the surface of the second gate dielectric layer.

6. The method of claim 5, wherein the gate structures further comprises:
   a plurality of sidewalls on the side surfaces of the first gate dielectric layer, the floating gate layer, the second gate dielectric layer, the controlling gate layers, and the first barrier layer.

7. The method of claim 1, wherein the interconnecting structures comprise:
   a plurality of interconnecting plugs on the surfaces of the first conductive layers; and
   a plurality of interconnecting layers on the surfaces of the interconnect plugs;
   wherein the interconnecting layers in the device region are connected to source line plugs on the surfaces of adjacent source interconnecting lines through the interconnect plugs.

8. The method of claim 1, further comprising:
   forming a plurality of second plugs in the fifth dielectric layer, wherein: the second plugs are located on the surfaces of the interconnecting structures;
   the second conductive layers are located on the top surface of the second plugs; and
   the second conductive layers in the device region are connected to the second drain region plugs that are located on top of adjacent drain region trenches through the second plugs and the interconnecting structures.

9. The method of claim 1, further comprising:
   forming a plurality of third plugs in the sixth dielectric layer, wherein:
   the third plugs are located on the surface of the second dielectric layer;
   the third conductive layers are located on the top surfaces of the third plugs; and
   the third conductive layers are connected to the controlling gate plugs in the peripheral region through the third plugs, the second conductive layers, and the interconnecting structures.

10. The method of claim 1, wherein a material of the first dielectric layer is different from a material of the second barrier layer.

11. The method of claim 1, wherein the locations of the source line plugs are corresponding to the locations of the isolation structures at the bottom of the source region trenches.

12. The method of claim 1, further comprising a method for forming the source line plugs, the second drain region plugs, and the controlling gate plugs, including:
   forming a plurality of first via holes in the second dielectric layer, wherein the first via holes expose partial surfaces of the source interconnecting lines in the device region, the first drain region plugs, and the first barrier layer in the peripheral region;
   etching the first barrier layer on the bottom of the first via holes in the peripheral region until the surfaces of the controlling gate layers are exposed, to form the controlling gate via holes in the peripheral region; and
   filling a conductive material into the first via holes in the device region and the controlling gate via holes in the peripheral region, to form the source line plugs and the second drain region plugs in the device region, and to form the controlling gate plugs in the peripheral region.

13. A memory device structure, comprising:
   a substrate including a device region and a peripheral region, wherein the device region of the substrate includes a plurality of isolation structures, the substrate between adjacent isolation structures includes active regions;
   a plurality of gate structures on the surface of the substrate, wherein a plurality of source region trenches and a plurality of drain region trenches are located on two sides of the gate structures respectively, a plurality of source regions are located in the active regions at the bottom of the source region trenches, a plurality of drain regions are located in the active regions at the bottom of the drain region trenches, and the gate structures include a plurality of controlling gate layers, and a first barrier layer on the surfaces of the controlling gate layers;
   a first dielectric layer, a second barrier layer, a plurality of source interconnecting lines, and a plurality of drain region plugs, wherein the source interconnecting line are located in the source region trenches in the device region, and the first drain region plugs are located on the surfaces of the drain regions in the device region;

a second dielectric layer on the surfaces of the first dielectric layer, the second barrier layer, the first drain region plugs, and the source interconnecting lines, wherein the second dielectric layer in the device region include a plurality of source line plugs on the surfaces of the source interconnecting lines, and a plurality of second drain region plugs on the first drain region plugs, and the second dielectric layer and the first barrier layer in the peripheral region include a plurality of controlling gate plugs on the surfaces of the controlling gate layers;

a third dielectric layer on the surface of the second dielectric layer, wherein the third dielectric layer includes a plurality of first conductive layers on the source line plugs, the second drain region plugs, and the controlling gate plugs;

a fourth dielectric layer on the third dielectric layer and the first conductive layers, wherein the fourth dielectric layer includes a plurality of interconnecting structures on the surfaces of the first conductive layers;

a fifth dielectric layer on the surfaces of the fourth dielectric layer and the interconnecting structures, wherein the fifth dielectric layer includes a plurality of second conductive layers; and a sixth dielectric layer on the surfaces of the fifth dielectric layer and the second conductive layers, wherein the sixth dielectric layer includes a plurality of third conductive layers.

14. The memory device structure of claim 13, wherein:
the gate structures extend from the device region to the surface of the peripheral region and extend cross the surfaces of the active regions;
the bottom portions of the source region trenches and the drain region trenches expose the surfaces of the active regions and the isolation structures in the device region and the peripheral region;
the first dielectric layer is located on the surfaces of the active regions and the isolation structures, the second barrier layer is located on the surfaces of the isolation structures in the device region trenches, and in the drain region trenches and the source region trenches in the peripheral region;
the source line plugs on top of a same source interconnecting line are connected to a same first conductive layer;
the interconnecting structures in the device region are connected to corresponding adjacent source interconnecting lines through the first conductive layers and the source line plugs;
the second conductive layers in the device region are connected to the second drain region plugs that are located on top of the adjacent drain region trenches through the interconnecting structures; and
the third conductive layers are connected to the controlling gate plugs in the peripheral region through the second conductive layers and the interconnecting structures.

15. The memory device structure of claim 13, wherein the gate structures further comprises:
a first gate dielectric layer on the surfaces of the source regions of the substrate;
a floating gate layer on the surface of the first gate dielectric layer; and
a second gate dielectric layer on the surface of the floating gate layer and the isolation structures;
wherein the controlling gate layers are located on the surface of the second gate dielectric layer.

16. The memory device structure of claim 15, wherein the gate structures further comprises:
a plurality of sidewalls on the side surfaces of the first gate dielectric layer, the floating gate layer, the second gate dielectric layer, the controlling gate layers, and the first barrier layer.

17. The memory device structure of claim 13, wherein the interconnecting structures comprise:
a plurality of interconnecting plugs on the surfaces of the first conductive layers; and
a plurality of interconnecting layers on the surfaces of the interconnect plugs;
wherein the interconnecting layers in the device region are connected to source line plugs on the surfaces of adjacent source interconnecting lines through the interconnect plugs.

18. The memory device structure of claim 13, further comprising: a plurality of second plugs in the fifth dielectric layer, wherein:
the second plugs are located on the surfaces of the interconnecting structures;
the second conductive layers are located on the top surface of the second plugs; and
the second conductive layers in the device region are connected to the second drain region plugs that are located on top of adjacent drain region trenches through the second plugs and the interconnecting structures.

19. The memory device structure of claim 13, further comprising:
a plurality of third plugs in the sixth dielectric layer, wherein:
the third plugs are located on the surface of the second dielectric layer;
the third conductive layers are located on the top surfaces of the third plugs; and
the third conductive layers are connected to the controlling gate plugs in the peripheral region through the third plugs, the second conductive layers, and the interconnecting structures.

20. The memory device structure of claim 13, wherein:
a material of the first dielectric layer is different from a material of the second barrier layer; and
the locations of the source line plugs are corresponding to the locations of the isolation structures at the bottom of the source region trenches.

* * * * *